US010355085B1

(12) United States Patent
Huang et al.

(10) Patent No.: US 10,355,085 B1
(45) Date of Patent: Jul. 16, 2019

(54) SEMICONDUCTOR DEVICES WITH REGROWN CONTACTS AND METHODS OF FABRICATION

(71) Applicant: NXP USA, Inc., Austin, TX (US)

(72) Inventors: Jenn Hwa Huang, Chandler, AZ (US); Yuanzheng Yue, Chandler, AZ (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 15/856,862

(22) Filed: Dec. 28, 2017

Related U.S. Application Data

(63) Continuation-in-part of application No. 15/856,442, filed on Dec. 28, 2017.

(51) Int. Cl.
*H01L 29/08* (2006.01)
*H01L 29/66* (2006.01)
(Continued)

(52) U.S. Cl.
CPC .... *H01L 29/0843* (2013.01); *H01L 21/30612* (2013.01); *H01L 21/30621* (2013.01);
(Continued)

(58) Field of Classification Search
CPC ............ H01L 29/0843; H01L 29/0847; H01L 29/66318; H01L 29/1004; H01L 21/30621;
(Continued)

(56) References Cited

U.S. PATENT DOCUMENTS 5,567,961 A * 10/1996 Usagawa ............ H01L 27/0605
257/192
7,728,359 B2 * 6/2010 Morita ................ H01L 29/2003
257/198
(Continued)

FOREIGN PATENT DOCUMENTS

CN 107230625 A 10/2017

OTHER PUBLICATIONS

Non-Final Office Action dated Jun. 5, 2018 for U.S. Appl. No. 15/856,442 12 pgs.
(Continued)

*Primary Examiner* — William Coleman

(57) ABSTRACT

An embodiment of a semiconductor device includes a semiconductor substrate that includes an upper surface and a semiconductor layer, a first dielectric layer disposed over the semiconductor substrate, and a regrown contact formed through a first opening in the first dielectric layer. The regrown contact includes a regrown region formed over the semiconductor substrate, an overhang region coupled to the regrown region and formed over the first dielectric layer, adjacent the first opening, and a conductive cap formed over the regrown region and the overhang region. A method for fabricating the semiconductor device includes forming the first dielectric layer over the semiconductor substrate, forming the first opening in the first dielectric layer, forming a regrown semiconductor layer within the first opening and over the first dielectric layer, forming a conductive cap over the regrown semiconductor layer, and etching the regrown semiconductor layer outside the conductive cap.

20 Claims, 13 Drawing Sheets

(51) Int. Cl.
*H01L 29/10* (2006.01)
*H01L 21/306* (2006.01)
*H01L 29/20* (2006.01)
*H01L 29/45* (2006.01)
*H01L 29/732* (2006.01)
*H01L 29/778* (2006.01)
*H01L 29/737* (2006.01)
*H01L 29/205* (2006.01)

(52) U.S. Cl.
CPC ...... *H01L 29/0817* (2013.01); *H01L 29/0847* (2013.01); *H01L 29/1004* (2013.01); *H01L 29/2003* (2013.01); *H01L 29/452* (2013.01); *H01L 29/66318* (2013.01); *H01L 29/66462* (2013.01); *H01L 29/0891* (2013.01); *H01L 29/205* (2013.01); *H01L 29/732* (2013.01); *H01L 29/7371* (2013.01); *H01L 29/7787* (2013.01)

(58) Field of Classification Search
CPC ............... H01L 29/452; H01L 29/2003; H01L 29/66462; H01L 29/0817; H01L 21/30612; H01L 29/732; H01L 29/7787; H01L 29/7271; H01L 29/0891; H01L 29/205
See application file for complete search history.

(56) References Cited

U.S. PATENT DOCUMENTS

| | | | |
|---|---|---|---|
| 8,698,164 | B2 | 4/2014 | Disney et al. |
| 8,803,246 | B2 * | 8/2014 | Wu ............ H01L 29/2003 257/348 |
| 8,900,985 | B2 * | 12/2014 | Curatola ........ H01L 29/66462 257/11 |
| 9,006,791 | B2 | 4/2015 | Kub et al. |
| 9,117,839 | B2 | 8/2015 | Kizilyalli et al. |
| 9,184,275 | B2 * | 11/2015 | Mishra ............ H01L 29/402 |
| 9,911,843 | B2 | 3/2018 | Umeda et al. |
| 2008/0176366 | A1 | 7/2008 | Mita et al. |
| 2008/0296618 | A1 | 12/2008 | Suh et al. |
| 2013/0320350 | A1 | 12/2013 | Haberlen et al. |
| 2016/0086878 | A1 * | 3/2016 | Otremba ......... H01L 23/49575 257/139 |
| 2016/0190351 | A1 | 6/2016 | Kizilyalli et al. |

OTHER PUBLICATIONS

McCarthy, L.S. et al; "AlGaN/GaN Heterojunction Bipolar Transistor"; IEEE Electron Device Letters, vol. 20, No. 6; 3 pages (Jun. 1999).

Shinohara, K. et al; "Self-Aligned-Gate GaN-HEMTs with Heavily-Dopedn+-GaN Ohmic Contacts to 2DEG"; IEEE International Electron Devices Meeting, San Francisco, Ca; Dec. 10-13, 2012.

* cited by examiner

US 10,355,085 B1

SEMICONDUCTOR DEVICES WITH REGROWN CONTACTS AND METHODS OF FABRICATION

RELATED APPLICATION

This application is a continuation-in-part of U.S. patent application Ser. No. 15/856,442, filed on Dec. 28, 2017, entitled "Semiconductor Devices with Regrown Contacts and Methods of Fabrication," which is incorporated herein by reference in its entirety.

TECHNICAL FIELD

Embodiments of the subject matter described herein relate generally to semiconductor devices with regrown ohmic contacts and methods for fabricating such devices.

BACKGROUND

Semiconductor devices find application in a wide variety of electronic components and systems. Useful semiconductor devices for radio frequency (RF) and high-speed applications may include heterojunction field effect transistors (HFET's), metal-insulator field effect transistors (MISFET's), junction field effect transistors (JFET's), and bipolar devices (e.g. bipolar junction transistors (BJT's) and heterojunction bipolar transistors (HBT's)). Semiconductor devices may be formed from group-III nitride (III-N) semiconductors. Semiconductor devices may include ohmic contacts such as drain/source contacts, gate contacts, emitter/collector contacts, and control electrodes such as gate contacts or base contacts. Accordingly, there is a need for semiconductor devices with manufacturable, high performance, and reliable ohmic contacts and control electrodes (e.g., drain/source contacts, gate contacts, emitter/collector contacts, and base contacts) as well as methods for making such semiconductor devices.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

The following detailed description is merely illustrative in nature and is not intended to limit the embodiments of the subject matter or the application and uses of such embodiments. As used herein, the words "exemplary" and "example" mean "serving as an example, instance, or illustration." Any implementation described herein as exemplary or an example is not necessarily to be construed as preferred or advantageous over other implementations. Furthermore, there is no intention to be bound by any expressed or implied theory presented in the preceding technical field, background, or the following detailed description.

Figure 1:
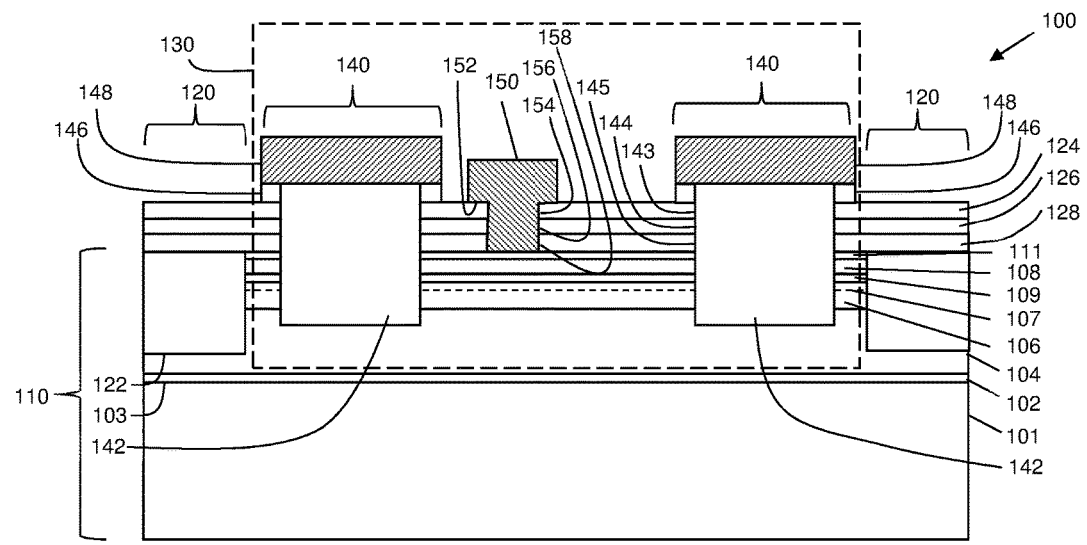
FIG. 1 is a cross-sectional, side view of an exemplary GaN heterojunction field effect transistor (HFET) with a regrown contact in accordance with an embodiment.

FIG. 1 is a cross-sectional, side view of an exemplary GaN heterojunction field effect transistor (HFET) device 100 with a regrown contact in accordance with an embodiment. In an embodiment, the GaN HFET device 100 includes a semiconductor substrate 110, an isolation region 120, a first dielectric layer 124, a second dielectric layer 126, a third dielectric layer 128, an active region 130, source/drain regions 140 (i.e. regrown contacts), and a gate electrode 150. As is described more fully below, the GaN HFET device 100 is substantially contained within the active region 130 defined by the isolation region 120, with source/drain regions 140, and gate electrode 150 over semiconductor substrate 110.

In an embodiment, the semiconductor substrate 110 may include a host substrate 101, a nucleation layer 102 disposed over the host substrate, a buffer layer 104 disposed over the nucleation layer 102, a channel layer 106 disposed over the buffer layer 104, a barrier layer 108 disposed over the channel layer 106, and a cap layer 111 disposed over the channel layer 106. In an embodiment, the host substrate 101 may include silicon carbide (SiC). In other embodiments, the host substrate 101 may include other materials such as sapphire, silicon (Si), GaN, aluminum nitride (AlN), diamond, poly-SiC, silicon on insulator, gallium arsenide (GaAs), indium phosphide (InP), and other substantially insulating or high resistivity materials. The nucleation layer 102 may be formed on an upper surface 103 of the host substrate 101. The buffer layer 104 may include a number of group III-N semiconductor layers and is supported by the host substrate 101. Each of the semiconductor layers of the buffer layer 104 may include an epitaxially grown group III-nitride eptiaxial layer. The group-III nitride epitaxially layers that make up the buffer layer 104 may be nitrogen (N)-face or gallium (Ga)-face material, for example. In other embodiments, the semiconductor layers of the buffer layer 104 may not be epitaxially grown. In still other embodiments, the semiconductor layers of the buffer layer 104 may include Si, GaAs, InP, or other suitable materials.

In an embodiment, the buffer layer 104 is grown epitaxially on the host substrate 101. The buffer layer 104 may include at least one AlGaN mixed crystal layer having a composition denoted by $Al_XGa_{1-X}N$ with an aluminum mole fraction, X, that can take on values between 0 and 1. The total thickness of the buffer layer 104 with all of its layers may be between about 200 angstroms and about 100,000 angstroms although other thicknesses may be used. A limiting X value of 0 yields pure GaN while a value of 1 yields pure aluminum nitride (AlN). An embodiment includes a buffer layer 104 disposed over the nucleation layer 102 comprised of AlN. The nucleation layer 102 starts at the upper surface 103 of the host substrate 101 and extends about 100 angstroms to about 2000 angstroms above the upper surface 103. The buffer layer 104 may include additional $Al_XGa_{1-X}N$ layers. The thickness of the additional $Al_XGa_{1-X}N$ layer(s) may be between about 200 angstroms and about 50,000 angstroms though other thicknesses may be used. In an embodiment, the additional $Al_XGa_{1-X}N$ layers may be configured as GaN (X=0) where the $Al_XGa_{1-X}N$ is not intentionally doped (NID). The additional $Al_XGa_{1-X}N$ layers may also be configured as one or more GaN layers where the one or more GaN layers are intentionally doped with dopants that may include iron (Fe), chromium (Cr), carbon (C) or other suitable dopants that render the buffer layer 104 substantially insulating or high resistivity. The dopant concentration may be between about $10^{17}$ cm$^{-3}$ and $10^{19}$ cm$^{-3}$ though other higher or lower concentrations may be used. The additional $Al_XGa_{1-X}N$ layers may be configured with X=0.01 to 0.10 where the $Al_XGa_{1-X}N$ is NID or, alternatively, where the $Al_XGa_{1-X}N$ is intentionally doped with Fe, Cr, C, or other suitable dopant species. In other embodiments (not shown), the additional layers may be configured as a superlattice where the additional layers include a series of alternating NID or doped $Al_XGa_{1-X}N$ layers where the value of X takes a value between 0 and 1. In still other embodiments, the buffer layer 104 may also include one or more indium gallium nitride (InGaN) layers, with composition denoted $In_YGa_{1-Y}N$, where Y, the indium mole fraction, may take a value between 0 and 1. The thickness of the InGaN layer(s) may be between about 50 angstroms and about 2000 angstroms though other thicknesses may be used.

In an embodiment, a channel layer 106 may be formed over the buffer layer 104. The channel layer 106 may include one or more group III-N semiconductor layers and is supported by the buffer layer 104. The channel layer 106 may include an $Al_XGa_{1-X}N$ layer where X takes on values between 0 and 1. In an embodiment, the channel layer 106 is configured as GaN (X=0) although other values of X may be used without departing from the scope of the inventive subject matter. The thickness of the channel layer 106 may be between about 50 angstroms and about 10,000 angstroms though other thicknesses may be used. The channel layer 106 may be NID or, alternatively, may include Si, germanium (Ge), C, Fe, Cr, or other suitable dopants. The dopant concentration may be between about $10^{16}$ cm$^{-3}$ and about $10^{19}$ cm$^{-3}$ though other higher or lower concentrations may be used. In other embodiments, the channel layer may include NID or doped $In_YGa_{1-Y}N$, where Y, the indium mole fraction, may take a value between 0 and 1.

A barrier layer 108 may be formed over the channel layer 106 in accordance with an embodiment. The barrier layer 108 may include one or more group III-N semiconductor layers and is supported by the channel layer 106. In some embodiments, the barrier layer 108 has a larger bandgap and larger spontaneous polarization than the channel layer 106 and, when the barrier layer 108 is in direct contact with the channel layer 106, a channel 107 is created in the form of a two-dimensional electron gas (2-DEG) within the channel layer 106 near the interface between the channel layer 106 and barrier layer 108. In addition, strain between the barrier layer 108 and channel layer 106 may cause additional piezoelectric charge to be introduced into the 2-DEG and channel. The barrier layer 108 may include at least one NID $Al_XGa_{1-X}N$ layer where X takes on values between 0 and 1. In some embodiments, X may take a value of 0.1 to 0.35, although other values of X may be used. The thickness of the barrier layer 108 may be between about 50 angstroms and about 1000 angstroms though other thicknesses may be used. The barrier layer 108 may be NID or, alternatively, may include Si, Ge, C, Fe, Cr, or other suitable dopants. The dopant concentration may be between about $10^{16}$ and $10^{19}$ cm$^{-3}$ though other higher or lower concentrations may be used. In an embodiment, an additional AlN interbarrier layer 109 formed between the channel layer 106 and the barrier layer 108, according to an embodiment. The AlN interbarrier layer may increase the channel charge and improve the electron confinement of the resultant 2-DEG. In other embodiments, the barrier layer 108 may include indium aluminum nitride (InAlN) layers, denoted $In_YAl_{1-Y}N$, where Y, the indium mole fraction, may take a value between about 0.1 and about 0.2 though other values of Y may be used. In the case of an InAlN barrier, the thickness of the barrier layer 108 may be between about 30 angstroms and about 2000 angstroms though other thicknesses may be used. In the case of using InAlN to form the barrier layer 108, the InAlN may be NID or, alternatively, may include Si, Ge, C, Fe, Cr, or other suitable dopants. The dopant concentration may be between about $10^{16}$ cm$^{-3}$ and about $10^{19}$ cm$^{-3}$ though other higher or lower concentrations may be used.

In an embodiment illustrated in FIG. 1, a cap layer 111 may be formed over the barrier layer 108. The cap layer 111 presents a stable surface for the semiconductor substrate 110 and serves to protect the surface of the semiconductor substrate 110 from chemical and environmental exposure incidental to wafer processing. The cap layer 111 may include one or more group III-N semiconductor layers and is supported by the barrier layer 108. In an embodiment, the cap layer 111 is GaN. The thickness of the cap layer 111 may be between about 5 angstroms and about 100 angstroms though other thicknesses may be used. The cap layer 111 may be NID or, alternatively, may include Si, Ge, C, Fe, Cr, or other suitable dopants. The dopant concentration may be between about $10^{16}$ cm$^{-3}$ and $10^{19}$ cm$^{-3}$ though other higher or lower concentrations may be used. Without departing from the scope of the inventive subject matter, it should be appreciated that the choice of materials and arrangement of layers to form semiconductor substrate 110 is exemplary. It should be appreciated that the inclusion of the host substrate 101, the nucleation layer 102, the buffer layer 104, the channel layer 106, the barrier layer 108, and the cap layer 111 into the semiconductor substrate 110 is exemplary and that the function and operation of the various layers may be combined and may change depending on the materials used in any specific embodiment. For example, in some embodiments (not shown), the cap layer 111 may be omitted. In other embodiments using N-polar materials (not shown) the channel layer 106 may be disposed over the barrier layer 108 to create a 2-DEG and channel directly underneath an optional cap 111 and the gate electrode 150. Still further embodiments may include semiconductor layers formed from materials including GaAs, aluminum gallium arsenide (AlGaAs), indium gallium arsenide (InGaAs), and aluminum indium arsenide (AlInAs) to form the semiconductor substrate 110.

One or more isolation region(s) 120 may be formed in the semiconductor substrate 110 to define an active region 130 above and along the upper surface 103 of the host substrate 101, according to an embodiment. The isolation regions 120 may be formed via an implantation procedure configured to damage the epitaxial and/or other semiconductor layers to create high resistivity regions 122 of the semiconductor substrate 110 rendering the semiconductor substrate 110 high resistivity or semi-insulating in those high resistivity regions 122 while leaving the crystal structure intact in the active region 130. In other embodiments, the isolation regions 120 may be formed by removing one or more of the epitaxial and/or other semiconductor layers of the semiconductor substrate 110 rendering the remaining layers of the semiconductor substrate 110 semi-insulating and leaving behind active region 130 "mesas" surrounded by high resistivity or semi-insulating isolation regions 120. In still other embodiments, the isolation regions 120 may be formed by removing one or more of the epitaxial and/or other semiconductor layers of the semiconductor substrate 110 and then using ion implantation to damage and further enhance the semi-insulating properties of the remaining layers of the semiconductor substrate 110 and leaving behind active region 130 "mesas" surrounded by high resistivity or semi-insulating isolation regions 120 that have been implanted. In an embodiment, a first dielectric layer 124 may be formed over the active region 130 and isolation regions 120. In an embodiment, the first dielectric layer 124 may be formed from one or more suitable materials including silicon dioxide ($SiO_2$), silicon nitride (SiN), silicon oxynitride (SiON), aluminum oxide ($Al_2O_3$), aluminum nitride (AlN), and hafnium oxide ($HfO_2$), though other substantially insulating materials may be used. In an embodiment, the first dielectric layer 124 may have a thickness of between 200 angstroms and 1000 angstroms. In other embodiments, the first dielectric layer 124 may have a thickness of between 50 angstroms and 10000 angstroms, though other thicknesses may be used. A second dielectric layer 126 (e.g. an etch stop layer) may be formed over the semiconductor substrate 110 between the semiconductor substrate and the first dielectric layer 124, in accordance with an embodiment. In an embodiment, the second dielectric layer 126 may be formed from one or more suitable materials including silicon dioxide ($SiO_2$), silicon nitride (SiN), aluminum oxide ($Al_2O_3$), aluminum nitride (AlN), and hafnium oxide ($HfO_2$), though other substantially insulating materials may be used. In an embodiment, the second dielectric layer 126 may have a thickness of between 200 angstroms and 1000 angstroms. In other embodiments, the second dielectric layer 126 may have a thickness of between 50 angstroms and 10000 angstroms, though other thicknesses may be used. In an embodiment, a third dielectric layer 128 may be formed over the semiconductor substrate 110, between the semiconductor substrate 110 and the second dielectric layer 126. The third dielectric layer 126 may be formed from one or more suitable materials including silicon dioxide ($SiO_2$), silicon nitride (SiN), aluminum oxide ($Al_2O_3$), aluminum nitride (AlN), and hafnium oxide ($HfO_2$), though other suitable, substantially insulating materials may be used. In an embodiment, the third dielectric layer 128 may have a thickness of between 200 angstroms and 1000 angstroms. In other embodiments, the third dielectric layer 128 may have a thickness of between 50 angstroms and 10000 angstroms, though other thicknesses may be used.

In an embodiment, source/drain regions 140 (i.e. regrown contacts) may be formed over and in contact with the semiconductor substrate 110 in the active region 130. In an embodiment, each of the source/drain regions 140 include a regrown region 142 formed over and within the semiconductor substrate 110. The regrown region 142 may include a heavily doped semiconductor layer. As used herein, the term "heavily doped semiconductor" means any semiconductor having a dopant concentration that exceeds the background dopant concentration (e.g., but not limited to GaN background concentration of between $10^{14}$ $cm^{-3}$ and $10^{16}$ $cm^{-3}$) by a factor of 10 or more. In an embodiment, the regrown region 142 may be doped with one or more n-type dopants such as Si or germanium (Ge). In an embodiment, the dopant concentration may be between $10^{18}$ $cm^{-3}$ and $10^{19}$ $cm^{-3}$. In other embodiments, dopant concentration may be between $10^{17}$ $cm^{-3}$ and $10^{21}$ $cm^{-3}$, though higher or lower dopant concentrations may be used. In an embodiment, the regrown region 142 may be formed within a first ohmic opening 143 (i.e. first opening), a second ohmic opening 144 (i.e. second opening), and a third ohmic opening 145 (i.e. third opening), created in the first dielectric layer 124, the second dielectric layer 126, and the third dielectric layer 128, respectively. In other embodiments, the second dielectric layer 126 and third dielectric layer 128 may be omitted. In some embodiments, the second dielectric layer 126 and/or the third dielectric layer 128 may be configured as etch stop layers. In an embodiment, the regrown region 142 may have a thickness of between about 20 angstroms and about 5000 angstroms. In other embodiments, the regrown region 142 may have a thickness of between 200 angstroms and 1000 angstroms, although other thicknesses may be used. In an embodiment, the regrown region 142 may be recessed through the cap layer 111, the barrier layer 108, and the channel layer 106. In an embodiment, the regrown region 142 may form an ohmic junction with the channel 107. The regrown region 142 may be recessed through the cap layer 111, the barrier layer 108, and extend partially through the channel layer 106, according to an embodiment. In other embodiments, the regrown region 142 may be formed over and in contact with the cap layer 111. In still other embodiments, the regrown region 142 may be recessed through the cap layer 111 and extend partially through the barrier layer 108. In an embodiment, overhang regions 146 may extend laterally from the regrown ohmic region 142 over one or more of the first dielectric layer 124, second dielectric layer 126, and third dielectric layer 128. In an embodiment, the overhang regions 146 include the same material (e.g. GaN) as the regrown ohmic region, but in a polycrystalline form. In other embodiments, the overhang regions 146 include single-crystal material that results from the lateral overgrowth of the regrown ohmic regions. The regrown region 142 and overhang regions 146 may be formed using epitaxial GaN grown by, for example, MOCVD or MBE deposition. In an embodiment, a conductive cap 148 may be disposed over the regrown ohmic region 142 and the overhang regions 146. The conductive cap 148 may be formed using single or multiple layers of conductive material that includes one or more of titanium (Ti), nickel (Ni), Al, copper (Cu), Si, Ge, platinum (Pt), palladium (Pd), and Gold (Au) and/or other suitable conductor or semiconductor materials used to form ohmic contacts. In an embodiment, the source/drain regions (i.e. regrown contacts) may be patterned by using the respective conductive caps 148 as hard masks to self-align the vertical exposed edges of the overhang regions 146 with the vertical exposed edges of the conductive caps 148. In an embodiment, the conductive cap 148 may be formed without using Au.

In an embodiment, the gate electrode 150 is formed over the semiconductor substrate 110 in the active region 130. The gate electrode 150 is electrically coupled to the channel 107 through the cap layer 111 and barrier layer 108. Changes to the electric potential on the gate electrode 150 shifts the quasi Fermi level for the barrier layer 108 with respect to the quasi Fermi level for the channel layer 106 and thereby modulates the electron concentration in the channel 107 within the semiconductor substrate 110 under the gate electrode 150. Schottky materials such as Ni, Pd, Pt, iridium (Ir), and Copper (Cu), may be combined with low stress conductive materials such as Al, Cu, poly Si, and/or Au in a metal stack to form a gate electrode 150 for a low-loss Schottky gate electrode electrically coupled to channel 107, according to an embodiment. In an embodiment, the gate electrode 150 may be formed within one or more of a first gate opening 154, a second gate opening 156, and a third gate opening. In an embodiment, the gate electrode 150 may be configured as a Schottky gate and may be formed over and directly in contact with the cap layer 111 of the semiconductor substrate 110 using a Schottky material layer and a low stress, conductive layer. A conductive, low-stress conductive layer (e.g. Al) may be formed over the Schottky material layer (e.g. Ni) to form gate electrode 150, in an embodiment. The gate electrode 150 may be T-shaped with a vertical stem and protruding regions 152 disposed over the first dielectric layers 124 as shown, or may be a square shape with no protruding regions over the dielectric layers, in other embodiments (not shown). In other embodiments, the gate electrode 150 may be recessed through the cap layer 111 and extend partially into the barrier layer 108 (not shown), increasing the electrical coupling of the gate electrode 150 to the channel 107 through the barrier layer 108.

Figure 2:
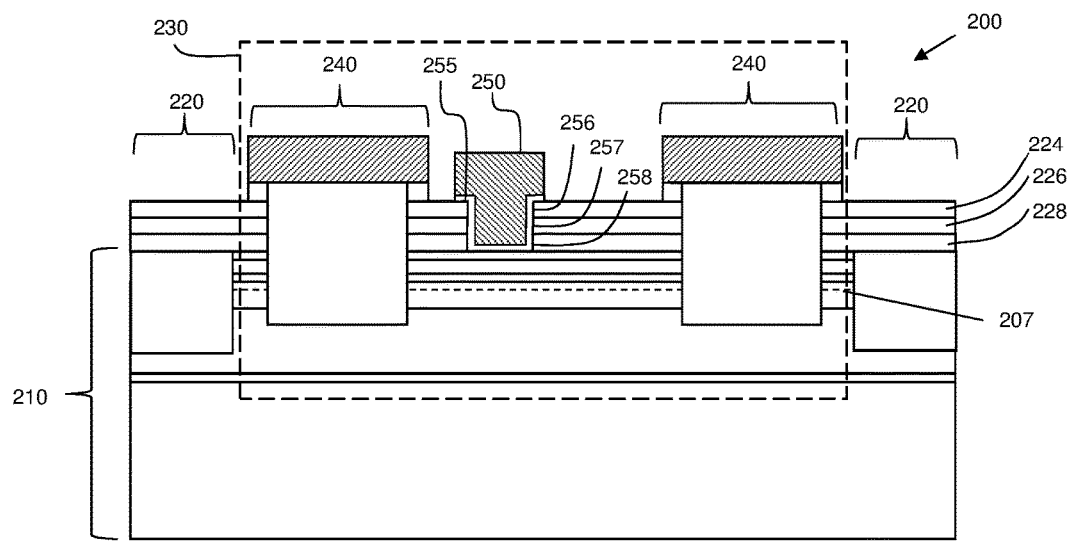
FIG. 2 is a cross-sectional, side view of an exemplary metal-insulator heterojunction field effect transistor (MISFET) with a regrown contact in accordance with an embodiment.

In another embodiment, and as shown in FIG. 2, a metal-insulator field effect transistor (MISFET) 200 may be formed over a semiconductor substrate 210. The semiconductor 210 may include one or more group III-N semiconductor layers including a host substrate, nucleation layer, buffer layer, channel layer, barrier layer, and cap layer arranged in a manner analogous to the semiconductor substrate 110 of FIG. 1. The MISFET 200 may include other components analogous to the GaN transistor 100 of FIG. 1. These components may include isolation regions 220, active regions 230, source/drain regions (i.e. regrown contacts) 240, and a gate electrode 250. In an embodiment, the gate electrode 250 may be formed over a gate dielectric 255 wherein the gate dielectric 255 is disposed between the semiconductor substrate 110 and a lower portion 257 of gate 250. The structure and arrangement of these components are described in connection with the description of the GaN HFET device 100 of FIG. 1. A first dielectric layer 224, a second dielectric layer 226, and a third dielectric layers 228 may be formed over the semiconductor substrate 210, according to an embodiment. In an embodiment, the gate dielectric 255 may be formed within the first gate opening 256, second gate opening 257, and third gate opening 258. In an embodiment, materials used to form gate dielectric 255 may include silicon dioxide ($SiO_2$), silicon nitride (SiN), aluminum oxide ($Al_2O_3$), aluminum nitride (AlN), hafnium oxide (HfO2), titanium oxide ($TiO_2$), and strontium oxide (SrO), though other suitable, substantially insulating materials may be used. In some embodiments, a single material may be used to form the gate dielectric 255. In other embodiments, the gate dielectric 255 may be formed by combining two or more gate dielectric materials in a multilayer stack (not shown). In still other embodiments, one or more of the second dielectric 226, and the third dielectric layer 228 may be used to form a gate dielectric layer (not shown). The gate dielectric 255 may have a thickness of between about 20 angstroms and about 10000 angstroms, according to an embodiment. In other embodiments, gate dielectric 255 may have a thickness of between about 500 angstroms and 500 angstroms, although other thicknesses may be used. In an embodiment, gate electrode 250 may be formed over the gate dielectric 255. In an embodiment, the gate electrode 250 and the gate dielectric 255 form a metal-insulator-semiconductor (MIS) junction. In other embodiments, the gate electrode 250 and the gate dielectric 255 may form a metal oxide semiconductor (MOS) junction. In any case, the gate electrode 250 is electrically coupled to the channel 207 through the gate dielectric 255.

Figure 3:
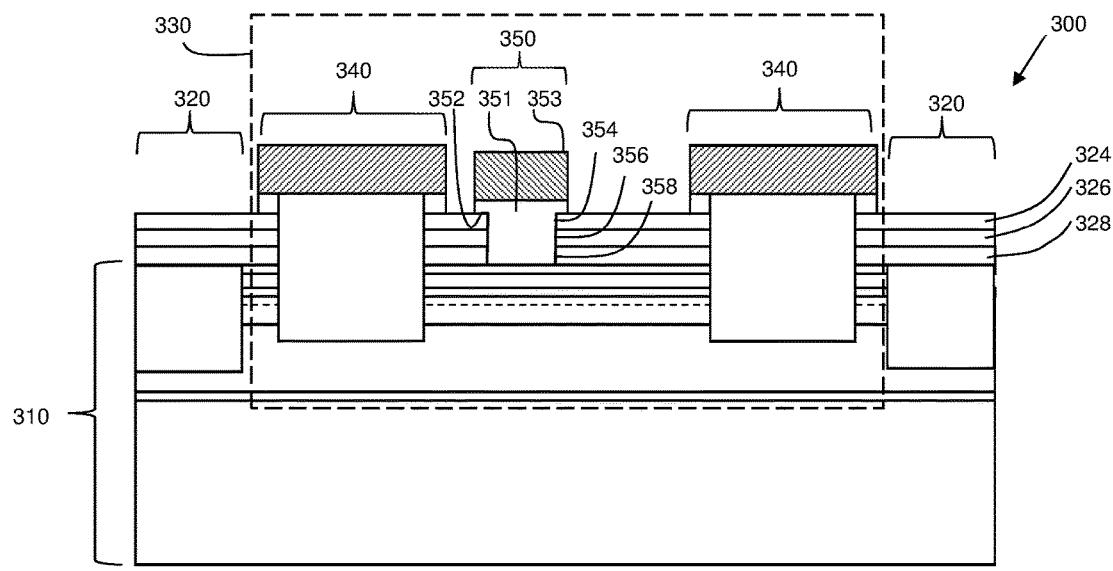
FIG. 3 is a cross-sectional, side view of an exemplary GaN junction field effect transistor (JFET) with a regrown contact in accordance with an embodiment.
Figure 4:
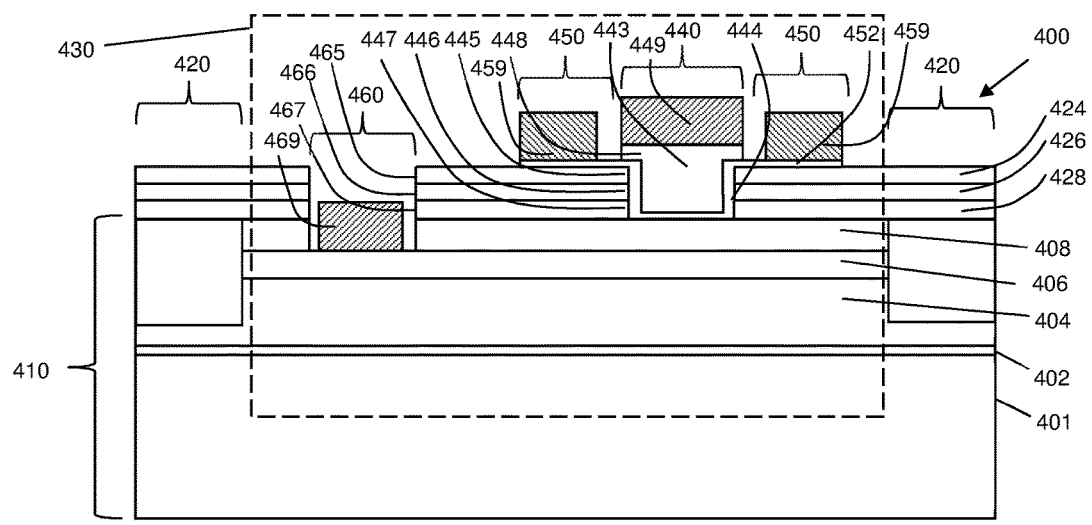
FIG. 4 is a cross-sectional, side view of an exemplary bipolar device with a regrown contact in accordance with an embodiment.

The foregoing described embodiments are exemplary. Without departing from the scope of the inventive subject matter, and as shown in FIG. 3, a junction field effect transistor (JFET) 300 may include one or more regrown contact(s) configured as a gate electrode and/or source and drain electrodes. In addition, and as shown in FIG. 4, a bipolar device 400 (e.g. transistor (BJT) or heterojunction bipolar transistor (HBT)) may include a regrown contact that takes the form as a regrown emitter/base.

Referring now to FIG. 3, in an embodiment, the JFET may include a semiconductor substrate 310, one or more isolation region(s) 320, an active region 330 formed in the semiconductor substrate 310, source/drain regions (i.e. regrown contacts) 340 formed within the active region 330, and a control electrode 350 formed over the semiconductor substrate 310 within the active region 330. First, second, and third dielectric layers 324, 326, and 328 may be formed over the semiconductor substrate 310, according to an embodiment. In an embodiment, the source/drain regions 340 may have the same structure and are analogous to the source/drain regions 140 of FIG. 1. In other embodiments (not shown), the source/drain regions 340 may include alloyed metal ohmic contacts. These alloyed ohmic contacts may include layers that include, but are not limited to titanium (Ti), Al, and barrier metals such as Pt, Pd, Ti-tungsten (TiW), Ti-tungsten nitride (TiWN), and other suitable metals. For example, a metal stack may include Ti formed over and in contact with the semiconductor substrate followed by Al formed over the Ti. A barrier layer (e.g. Pt, Ti, or TiW) may be formed between the Al and a conductive metal.

In an embodiment, the gate contact 350 (i.e. regrown contact) includes a regrown region 351, an overhang region 352, and a conductive cap 353. The gate electrode 350 may be formed within a first gate opening 354 (i.e. first opening), second gate opening 356 (i.e. second opening), and third gate opening 358 (i.e. third opening) over the semiconductor substrate 310 within first dielectric layer 324, second dielectric layer 324, and third dielectric layer 328, respectively. In an embodiment, the regrown region 351 of the gate contact 350 may contact the semiconductor substrate 310 to form a p-n junction with the cap layer 311, barrier layer 308, and channel layer 306. Changes to the electric potential on the control electrode 350 shifts the quasi Fermi level for the regrown region 351 with respect to the quasi Fermi level for the channel layer 306 and thereby modulates the electron concentration in the channel 307 within the semiconductor substrate 310 under the control electrode 350. In an embodiment, the regrown region 351 may include p-type GaN. In other embodiments, AlGaN, InGaN, or other suitable materials may be used. In an embodiment, the p-type GaN may be doped with Magnesium (Mg), C, or other suitable p-type dopant to a level of between $10^{18}$ cm$^{-3}$ and $10^{22}$ cm$^{-3}$.

A conductive cap 353 may be formed over the regrown region 351, according to an embodiment. In an embodiment, and analogous to the conductive cap 148 formed over the regrown region 142 of FIG. 1, the conductive cap 353 may be used to self-align the lateral extent of the regrown doped region by using the upper electrode as an etch mask when etching the semiconductor layer used to form the regrown region 351. The etching process may terminate on the first dielectric layer 324, leaving overhang regions 352 that are coupled to regrown region 351 that may remain at the edges of regrown region 351. In an embodiment, the overhang region 352 includes polycrystalline material. In other embodiments, the overhang region 352 includes laterally overgrown, single crystal semiconductor material.

Referring now to FIG. 4, in a further embodiment, a bipolar device with a regrown contact 400 includes a semiconductor substrate 410 and one or more isolation region(s) 420 formed within the semiconductor substrate 410 to define an active region 430. In an embodiment, a regrown emitter/base contact 440 (i.e. a regrown contact) may be formed within the active region 430, and a base contact 450 may be formed over the semiconductor substrate 410 and electrically coupled to a base region 444 within the regrown emitter/base contact 440. A collector region 460 may be formed over the semiconductor substrate 410 within the active region 430, adjacent the emitter/base contact 440.

In an embodiment, the semiconductor substrate 410 may include a host substrate 401, a nucleation layer 402 disposed over the host substrate, a buffer layer 404 disposed over the nucleation layer 402, a sub-collector layer 406 disposed over the buffer layer 404, and a collector layer 408 disposed over the sub-collector layer 406 (i.e. semiconductor layers). The host substrate 401, nucleation layer 402, and buffer layer 404 may be formed using materials and structures analogous to the host substrate 101, nucleation layer 102, and buffer layer 104 of FIG. 1, according to an embodiment. In an embodiment, the sub-collector layer 406 may include one or more doped semiconductor (e.g. GaN) layers. In an embodiment, the sub-collector layer 406 may have a thickness of between about 500 and 5000 angstroms. In other embodiments, the sub-collector layer 406 may have a thickness of between about 100 and 10000 angstroms, though other thicknesses may be used. In an embodiment, one or more semiconductor layers (e.g. GaN) may be used to form a collector layer 408 disposed over the sub-collector layer 406. In an embodiment, the collector layer 408 may have a thickness of between about 500 and 5000 angstroms. In other embodiments, the collector layer 408 may have a thickness of between about 100 and 200000 angstroms, though other thickness values may be used. In an embodiment (e.g. in an n-p-n BJT or HBT), one or more n-type dopant species may be used to dope the sub-collector layer 406 and collector layer 408. In an embodiment, the dopant species used to dope the sub-collector layer 406 and the collector layer 408 may include one or more of Si, Ge, 0 and/or other suitable dopant(s). In an embodiment, the dopant species may be incorporated during epitaxial growth of semiconductor substrate 410. In other embodiments, the dopant species may be implanted into the sub-collector layer 406 and the collector layer 408 during growth. In an embodiment, the sub-collector layer 406 layer may be doped to a level of between $10^{18}$ cm$^{-3}$ and $10^{20}$ cm$^{-3}$. In other embodiments, the sub-collector layer 406 may be doped to a level of between $10^{16}$ cm$^3$ and $10^{21}$ cm$^3$, though other higher or lower doping concentrations may be used. In an embodiment, the collector layer 408 may be doped to a level of between $10^{15}$ cm$^{-3}$ and $10^{19}$ cm$^{-3}$. In other embodiments, the collector layer 408 may be doped to a level of between $10^{14}$ cm$^{-3}$ and $10^{20}$ cm$^{-3}$, though other higher or lower doping concentrations may be used. Without departing from the scope of the inventive subject matter, the bipolar device 400 may be configured as an p-n-p transistor and the dopants used in the collector and sub-collector may include one or more p-type dopant(s) (e.g. Mg or other suitable dopant(s)).

One or more isolation region(s) 420 may be formed in the semiconductor substrate 410 to define an active region 430, according to an embodiment. Analogous to the discussion of the isolation region 120 and active region 130 of FIG. 1 above, the isolation region(s) 420 and active region 430 include first dielectric layer 424, second dielectric layer 426, and third dielectric layer 428. In an embodiment, the materials, structures, and characteristics of the isolation region(s) 420, active region(s) 430, and dielectric layers 424, 426, and 428 are analogous those of the GaN HFET 100 of FIG. 1 and may have similar compositions and structures that are adapted to be suitable for the bipolar device 400.

In an embodiment, the regrown emitter/base contact 440 (i.e. regrown contact) may be formed over and in contact with the semiconductor substrate 410 in the active region 430. In an embodiment, the regrown emitter/base contact 440 includes an emitter region 443 formed over the base region 444. In an embodiment, the emitter region 443 includes one or more group III-N layers and may have a thickness of between 200 angstroms and 2000 angstroms. In other embodiments, the emitter region 443 may include one or more III-N layers (e.g. GaN) and may have a thickness of between 100 angstroms and 10000 angstroms, although other thicknesses may be used. In an embodiment, the base region 444 includes one or more group III-N layers (e.g. GaN and/or AlGaN) and may have a thickness of between 200 angstroms and 2000 angstroms. In other embodiments, the base region 444 may have a thickness of between 50 angstroms and 10000 angstroms, although other thicknesses may be used. In an embodiment, the emitter region 443 may include a heavily doped semiconductor layer and the base region 444 may include a lightly doped semiconductor layer. As used herein, and analogous to the description of FIG. 1, the term "heavily doped semiconductor layer" means a semiconductor layer with a dopant concentration that exceeds the background dopant concentration (e.g., but not limited to GaN background concentration of between $10^{14}$ and $10^{16}$ cm$^{-3}$) by a factor of 100 or more. Likewise, the term the term "lightly doped semiconductor layer" means any semiconductor layer with a dopant concentration more than about 10 times less than that of a "heavily doped semiconductor layer" within an embodiment. In an embodiment, the emitter layer includes n-type doping and the base layer includes p-type doping. In an embodiment, the emitter region 443 may be doped with one or more n-type dopants such as Si or germanium (Ge). In an embodiment, the dopant concentration of the emitter region 443 may be between $10^{18}$ cm$^{-3}$ and $10^{20}$ cm$^{-3}$. In other embodiments, the dopant concentration of the emitter region 443 may be between $10^{17}$ cm$^{-3}$ and $10^{21}$ cm$^{-3}$, though higher or lower dopant concentrations may be used. The base region 444 may be doped with one or more p-type dopants such as Mg or C, though other suitable dopants may be used. In an embodiment, the dopant concentration of the base region 444 may be between $10^{16}$ cm$^{-3}$ and $10^{18}$ cm$^{-3}$. In other embodiments, the dopant concentration of the base region may be between $10^{15}$ cm$^{-3}$ and $10^{21}$ cm$^{-3}$, though higher or lower dopant concentrations may be used. In an embodiment, the emitter region 443 and the base region 444 may be formed within a first emitter/base opening 445 (i.e. first opening), a second emitter/base opening 446 (i.e. second opening), and a third emitter/base opening 447 (i.e. third opening), created in the first dielectric layer 424, the second dielectric layer 426, and the third dielectric layer 428. In other embodiments, the second dielectric layer 426 and third dielectric layer 428 may be omitted. In some embodiments, the second dielectric layer 426 and/or third dielectric layer 428 may be configured as etch stop layers. In an embodiment, the emitter region 443 may have a thickness of between about 20 angstroms and about 5000 angstroms. In other embodiments, the emitter region 442 may have a thickness of between 200 angstroms and 1000 angstroms, although other thicknesses may be used. In an embodiment, the base region 444 is grown between the collector layer 408 and the emitter region 443 may have a thickness of between about 20 angstroms and about 5000 angstroms. In an embodiment of the bipolar device 400 (e.g. a n-p-n BJT or HBT), the base region 444 may comprise one or more GaN, AlGaN, InGaN, and/or InAlN layers to form a heterojunction (e.g. AlGaN/GaN, InAlN) helpful in enhancing transport of minority carriers, according to an embodiment. In an embodiment, the emitter region 443 may form a n-p junction with the base region 444. The base region may form a p-n junction with the collector layer 408. During operation, minority electrons may be injected from the emitter region 443 into the base region 444 and then swept into the collector layer 408 and finally into the sub-collector layer 406. A base overhang region 452 may extend from the base region 444 laterally over the first dielectric layer 424. In an embodiment, a base overhang region 452 may extend laterally from the base region 443 over one or more of the first dielectric layer 424, the second dielectric layer 426, and the third dielectric layer 428. In an embodiment, the base overhang regions 452 include the same material (e.g. GaN and/or AlGaN) as the base region 444, but in a polycrystalline form. In other embodiments, the base overhang regions 452 include single-crystal material that results from the lateral overgrowth of the base region 444. In an embodiment, an emitter overhang region 448 may extend laterally from the emitter region 443 over the base overhang region 452. In an embodiment, the emitter overhang regions 448 include the same material (e.g. GaN and/or AlGaN) as the emitter region 443, but in a polycrystalline form. In other embodiments, the emitter overhang regions 448 include single-crystal material that results from the lateral overgrowth of the emitter region 443 and base region 444. The emitter region 443, the base region 444, the emitter overhang region 448, and base overhang region 452 may be formed using epitaxial GaN grown by, for example, MOCVD or MBE deposition. In an embodiment, an emitter cap (i.e. conductive cap) 449 may be disposed over the emitter region 443, base region 444, the emitter overhang region 448, and the base overhang region 452. The emitter cap 449 may be formed using single or multiple layers of metal that includes one or more of titanium (Ti), nickel (Ni), Al, copper (Cu), Ti-Tungsten (TiW), Si, Ge, and Gold (Au) and/or other suitable conductor or semiconductor materials used to form ohmic contacts. In an embodiment, the emitter/base region (i.e. regrown contact) may be patterned by using the emitter cap 449 as a hard mask to self-align the vertical exposed edges of the emitter overhang regions 448 with the vertical exposed edges of the emitter cap 449. In an embodiment, the emitter cap 449 may be formed without using Au. In an embodiment, a base cap (i.e. conductive cap) 459 may be disposed over the base overhang region 452. The base cap 459 may be formed using single or multiple layers of metal that includes one or more of titanium (Ti), nickel (Ni), Al, copper (Cu), Ti-Tungsten (TiW), Si, Ge, and Gold (Au) and/or other suitable conductor or semiconductor materials used to form ohmic contacts. Likewise, and in an embodiment, the base overhang region 452 may be patterned by using the base cap 459 as a hard mask to self-align the vertical exposed edges of the base overhang regions 452 with the vertical exposed edges of the base cap 459. In an embodiment, the base cap 459 may be formed without using Au. In an embodiment, a collector region 460 may be formed by creating first, second, and third collector openings 465, 466, and 467 in the first dielectric layer 424, the second dielectric layer 426, and the third dielectric layer 428, respectively. In an embodiment, the collector layer 408 may be etched to expose the sub-collector layer 406. The collector contact 469 may be formed on the sub-collector layer 406, in an embodiment. The collector contact 469 may be formed using single or multiple layers of metal that includes one or more of titanium (Ti), nickel (Ni), Al, copper (Cu), Ti-Tungsten (TiW), Si, Ge, and Gold (Au) and/or other suitable conductor or semiconductor materials used to form ohmic contacts. In an embodiment, the collector contact 469 may be formed without using Au.

Figure 5:
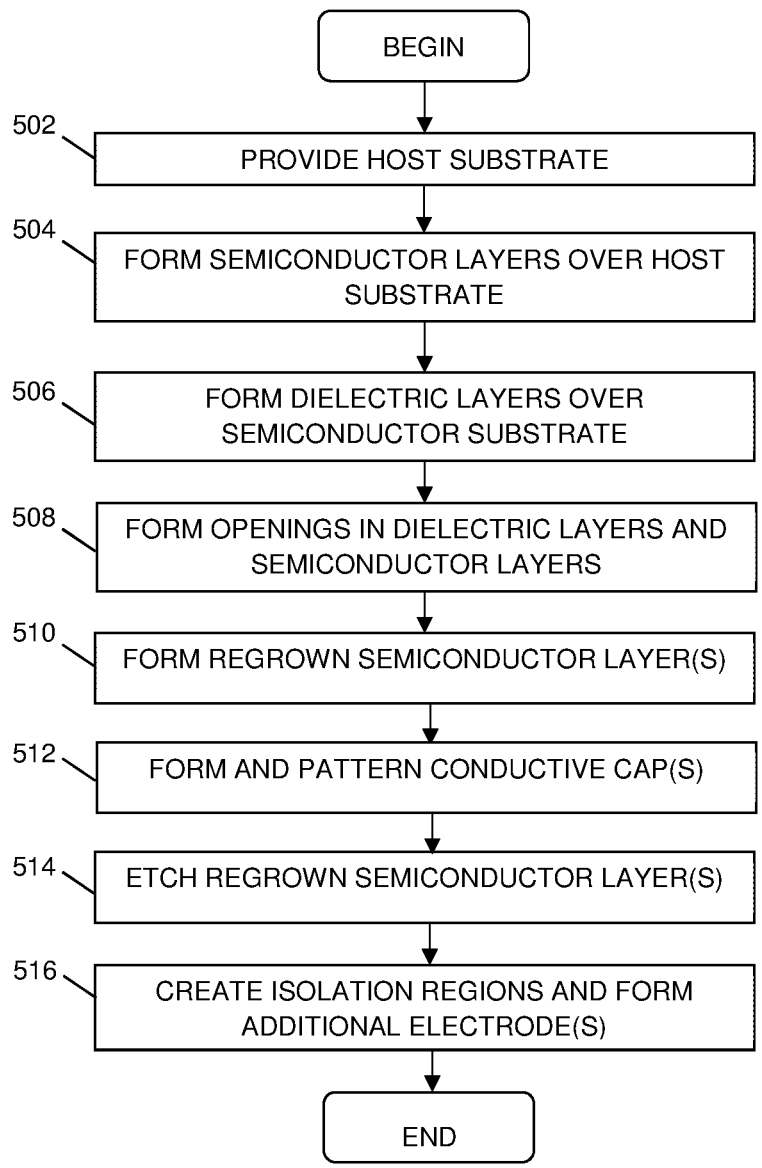
FIG. 5 is a process flow diagram describing a method for fabricating the semiconductor devices with regrown contacts of FIGS. 1-3 in accordance with an embodiment.

The flowchart of FIG. 5 describes embodiments of methods for fabricating semiconductor devices (e.g. devices 100, 200, and 300 of FIGS. 1-3) that include regrown contact regions (e.g. source/drain regions 140, 240, and 340 of FIG. 1-3 or gate electrode 350 of FIG. 3). FIG. 5 should be viewed alongside FIGS. 6-11 which illustrate cross-sectional, side views of a series of fabrication steps for producing the semiconductor device of FIG. 1, in accordance with an example embodiment. The MISFET 200 and JFET 300 embodiments shown in FIGS. 2 and 3 may be fabricated using analogous steps.

Figure 6:
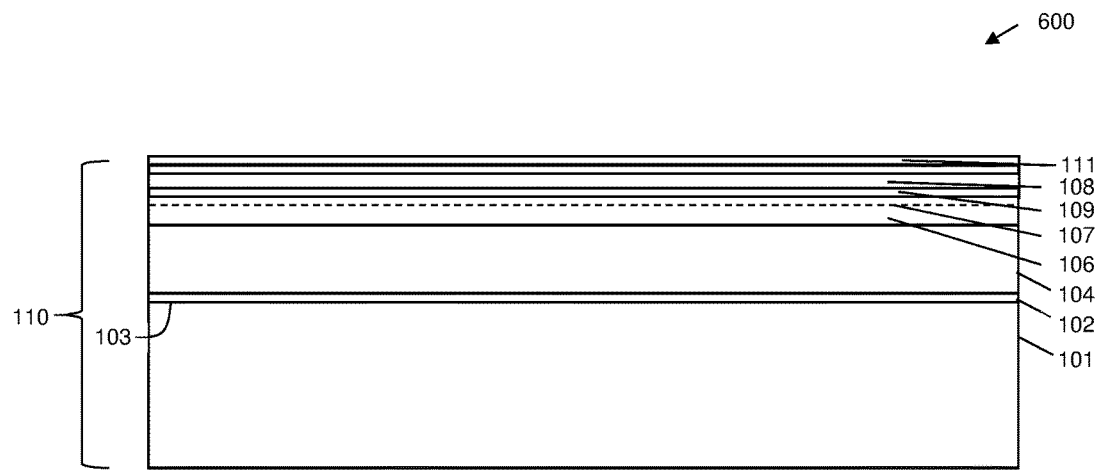
FIGS. 6-12 are cross-sectional, side views of a series of fabrication steps for producing the GaN HFET with a regrown contact of FIG. 1, in accordance with an embodiment of the method of fabrication.

Referring both to FIG. 5 and FIG. 6, the method may begin, in block 502 of FIG. 5 and as depicted in a step 600 of FIG. 6, by providing a host substrate 101. As discussed previously, and in an embodiment, the host substrate 101 may include SiC, or may include other materials such as sapphire, Si, GaN, AlN, diamond, poly-SiC, silicon on insulator, GaAs, InP, or other substantially insulating or high resistivity materials.

In block 504 of FIG. 5, and as depicted in the step 600 of FIG. 6, an embodiment of the method may include forming a number of semiconductor layers on or over the host substrate 101. Forming the semiconductor layers may include forming a nucleation layer 102 on or over an upper surface 103 of the host substrate 101, forming a buffer layer 104 on or over the nucleation layer 102, forming the channel layer 106 on or over the buffer layer 104, forming the barrier layer 108 on or over the channel layer 106, and forming the cap layer 111 on or over the barrier layer 108. As discussed previously, embodiments of the nucleation layer 102, the buffer layer 104, the channel layer 106, the buffer layer 108, and the cap layer 111 may include materials selected from AlN, GaN, AlGaN, InAlN, InGaN, or other suitable materials. The semiconductor layers 102, 104, 106, 108, and 111 may be grown using one of metal-organo chemical vapor deposition (MOCVD), molecular beam epitaxy (MBE), hydride-vapor phase epitaxy (HVPE) or a combination of these techniques, although other suitable techniques alternatively may be used. Semiconductor substrate 110 results.

Figure 7:
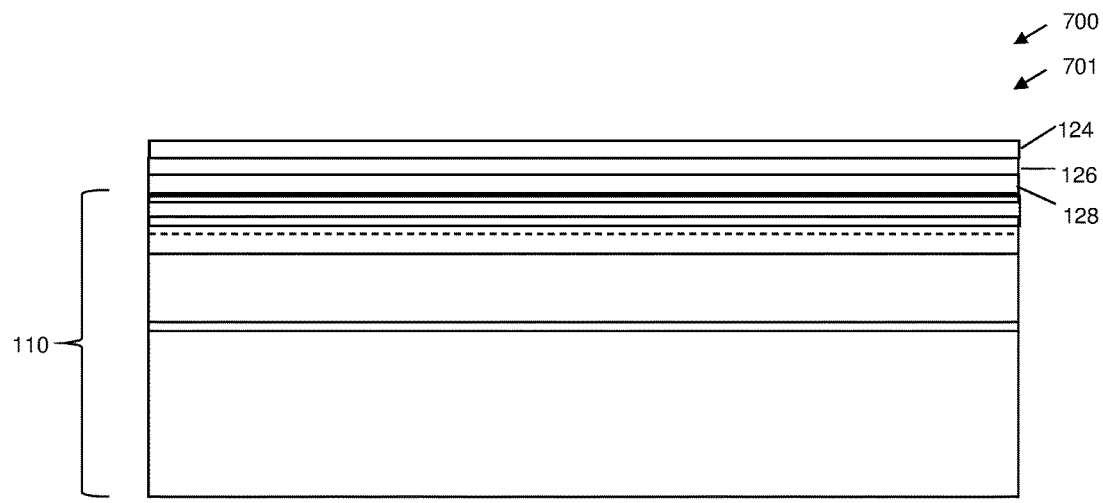

In block 506 of FIG. 5, and as depicted in a step 700 of FIG. 7, an embodiment of the method may include forming one or more of the first dielectric layer 124, the second dielectric layer 126, and the third dielectric layer 128 on or over the semiconductor substrate 110. As discussed previously, in an embodiment, the first dielectric layer 124, the second dielectric layer 126, and the third dielectric layer 128 may include materials selected from SiN, $Al_2O_3$, $SiO_2$, AlN, and $HfO_2$. The first dielectric layer 124, the second dielectric layer 126, and the third dielectric layer 128 may be formed using one or more of low pressure chemical vapor deposition (LPCVD), atomic layer deposition (ALD), sputtering, physical vapor deposition (PVD), plasma-enhance chemical vapor deposition (PECVD), MOCVD, MBE, inductively coupled plasma (ICP) deposition, electron-cyclotron resonance (ECR) deposition, or other suitable techniques. In other embodiments, one or more of the first dielectric layer 124, the second dielectric layer 126, and the third dielectric layer 128 may be formed, in-situ, immediately after and in the same chamber or deposition system (e.g. MOCVD or MBE) as the growth of the semiconductor layers of semiconductor substrate 110. Structure 701 results.

Figure 8:
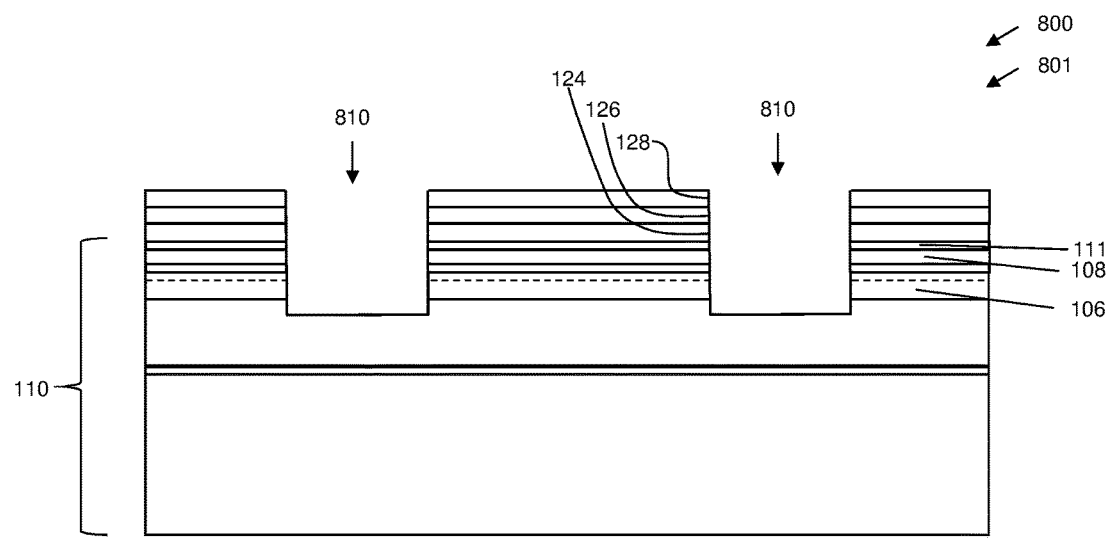

In block 508 of FIG. 5, and as depicted in a step 800 of FIG. 8, an embodiment of the method may include forming openings 810 in one or more the first dielectric layer 124, the second dielectric layer 126, and the third dielectric layer 128. In an embodiment, forming the openings 810 may include etching through the first dielectric layer 124, the second dielectric layer 126, and the third dielectric layer 128. Etching the first dielectric layer 124 (e.g. SiN) may include etching using one or more dry and/or wet etch technique(s) such as reactive ion etching (RIE), ICP etching, ECR etching, and wet chemical etching according to an embodiment. Suitable wet-etch chemistries may include hydrofluoric acid (HF), buffered HF, buffered oxide etch (BOE), phosphoric acid ($H_3PO_4$), or other suitable wet etchant(s), according to an embodiment. These dry etching techniques may use one or more of sulphur hexafluoride ($SF_6$), di-carbon hexafluoride ($C_2F_6$), carbon tetrafluoride ($CF_4$), tri-fluoromethane ($CHF_3$) or other suitable chemistry, to remove SiN, according to an embodiment. In an embodiment, the etchant used to etch the first dielectric 124 may selectively etch the first dielectric layer 124 and then stop on the second dielectric layer 126 wherein the second dielectric layer is configured as an etch stop (e.g. $Al_2O_3$ or AlN). In an embodiment, etching the second dielectric layer 126 (e.g. an $Al_2O_3$ or AlN etch stop layer) may include wet and/or dry etch techniques. In other embodiment(s), dry etching of the second dielectric layer 126 (e.g. an AlN or $Al_2O_3$ etch stop) may include dry etching using suitable techniques (e.g. RIE, ICP, or ECR) in conjunction chlorine-based chemistry such as $Cl_2$, boron trichloride ($BCl_3$), or other suitable dry-etch chemistries. In other embodiments, ion milling may be used to etch the second dielectric layer 126. In some embodiments, etching of the second dielectric layer 126 may include combining wet and dry chemistries. For example, in these embodiments, both ICP/RIE and BOE may be used to etch an $Al_2O_3$ etch stop layer. Etching the third dielectric layer 128 (e.g. SiN) may include etching using one or more wet or dry etch techniques analogous to etching the first dielectric layer 124, according to an embodiment.

In an embodiment, the method may also include forming openings 810 in one or more of the semiconductor layers included in semiconductor substrate 110. In an embodiment, the cap layer 111, barrier layer 108, and channel layer 106 may be etched. In an embodiment, etching the semiconductor layers (e.g. cap layer 111, barrier layer 108, and channel layer 106) may include wet and/or dry etch techniques. In other embodiment(s), dry etching of the semiconductor layers may include dry etching using suitable techniques (e.g. RIE, ICP, or ECR) in conjunction with chemistry such as $Cl_2$, boron trichloride ($BCl_3$), or other suitable dry-etch chemistries. Other etch techniques may include bromic acid (HBr). In some embodiments, the fluorine (F)-based chemistries (e.g. $SF_6$, $CF_4$ and the like) may be combined with chemistries (e.g. $BCl_3$ or $Cl_2$) used to etch GaN to allow selective etching of the semiconductor layers. For example, the cap and barrier layers 111 and 108 may be removed using a F-based etch, but etching may cease at the AlN interbarrier because aluminum fluoride prevents etching by F-based etchants. Structure 801 results. In other embodiments (not shown), the semiconductor layers of the semiconductor substrate 110 may not be etched.

Figure 9:
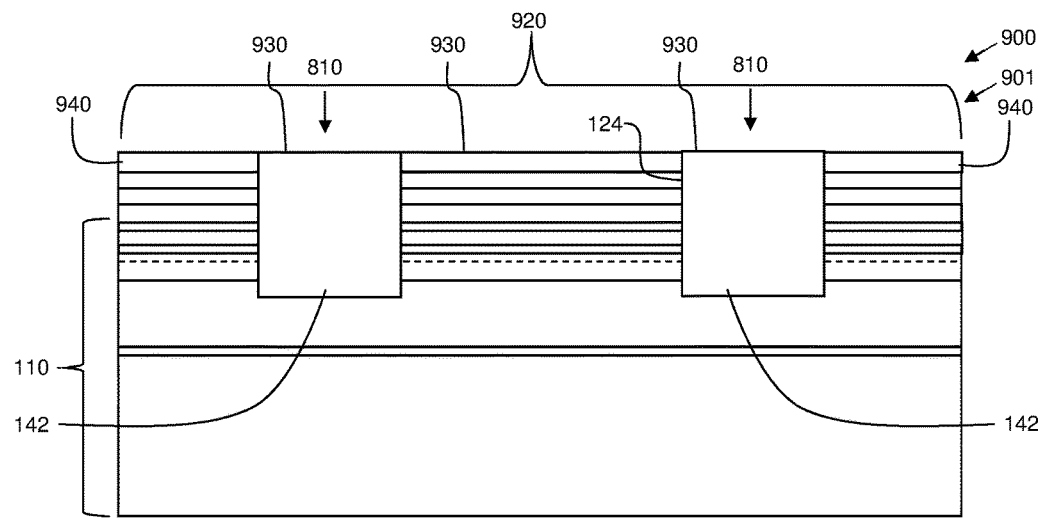

In block 510 of FIG. 5, and as depicted in a step 900 of FIG. 9, an embodiment of the method may include forming regrown regions 142 within one or more openings 810. Regrown regions 142 may be formed to realize regrown contacts (e.g. source/drain regions 140, 240, and 340) in FIGS. 1-3 and/or for the gate electrode 350 in the JFET of FIG. 3.

Referring specifically to the GaN HFET fabrication step 900 of FIG. 9, forming regrown regions 142 may include growing one or more regrown semiconductor layer(s) 920 over the structure 801 of FIG. 8. Forming the regrown semiconductor layer(s) 920 may include forming a contact portion 930 over the semiconductor substrate 110 and within the regrowth openings 810 and forming an exterior portion 940 grown over the first dielectric layer 124 outside the regrowth openings 810, according to an embodiment. In an embodiment, one of the regrown semiconductor layer(s) 920 may contact the semiconductor substrate 110 within the openings 810 and contact the first dielectric layer 124 outside the openings 810. In an embodiment, the regrown semiconductor layer(s) 920 are grown at a temperature between about 500 degrees Celsius and about 700 degrees Celsius. In other embodiments, the regrown semiconductor layer(s) 920 may be grown at temperatures between about 700 degrees Celsius and about 900 degrees Celsius. In still other embodiments, the regrown semiconductor layer(s) may be grown at temperatures between about 900 degrees Celsius and about 1200 degrees Celsius. Without departing from the scope of the inventive subject matter, the regrown semiconductor layers(s) 920 may be grown at other higher or lower temperatures. In an embodiment, the regrown semiconductor layer(s) 920 may be grown by MBE. In other embodiments, the regrown semiconductor layer(s) 920 may be grown by MOCVD. In still other embodiments the regrown semiconductor layer(s) 920 may be grown by physical vapor deposition (PVD), chemical vapor deposition (CVD), hydride vapor-phase epitaxy (HVPE), or other suitable technique(s). In an embodiment, the contact portion 930 of the regrown semiconductor layer(s) 920 may be formed as single crystal semiconductor layers. In other embodiments, the contact portion 930 of the regrown semiconductor layer(s) 920 may be formed as polycrystalline layers. In an embodiment, the exterior portion 940 of the regrown semiconductor layer(s) 920 may be formed as polycrystalline semiconductor layers. In other embodiments, the exterior portion 940 of the regrown semiconductor layer(s) 940 may be formed as single crystal semiconductor layers. In still other embodiments, the exterior portion 940 of the regrown semiconductor layer(s) may be formed as single crystal layers within a range of between about 100 angstroms and about 50000 angstroms outside the regrowth openings 910 and as polycrystalline semiconductor layers outside this range. Without departing from the scope of the inventive subject matter, the range of single crystal material within the exterior portions 940 of the regrown semiconductor layer(s) 920 formed outside the regrowth openings 910 may take on larger or smaller values than between about 100 angstroms and about 50000 angstroms. Structure 901 results.

Figure 10:
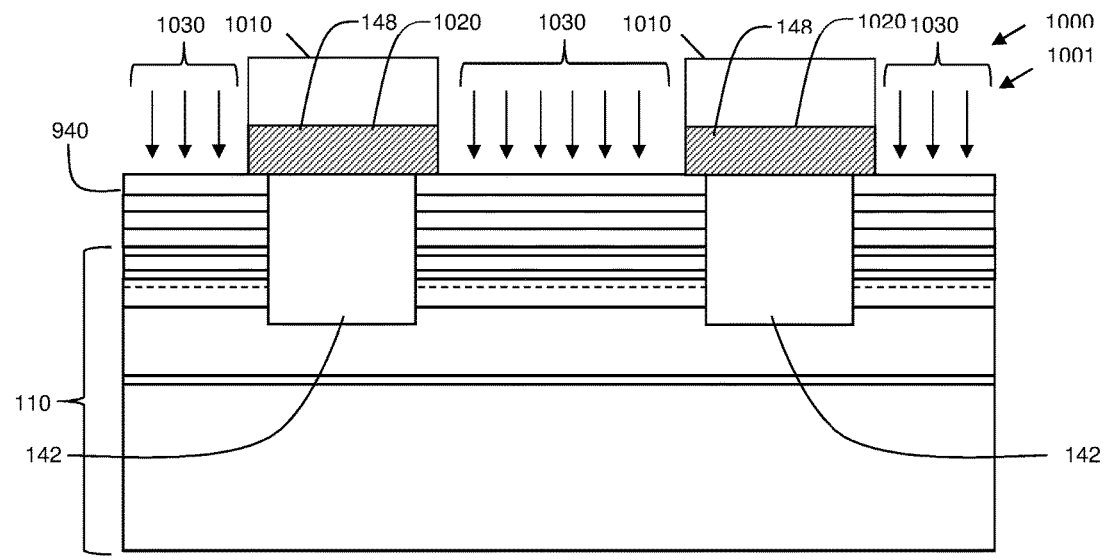

In block 512 of FIG. 5, and as depicted in step 1000 of FIG. 10, an embodiment of the method may include forming and patterning conductive caps 148 over the regrown regions. In an embodiment, the method may include disposing and patterning a resist layer 1010 (e.g. photo-resist) over a conductive cap metal layer 1020 and then using a dry etch 1030 to etch the conductive cap metal layer 1020. Dry etching the conductive cap metal layer 1020 (e.g. Ti/Al) may include etching using one or more dry etch technique(s) such as reactive ion etching (RIE), ICP etching, and/or ECR etching, according to an embodiment. Suitable dry etch chemistries include one or more of more etchants including, but not limited to, $SF_6$, $C_2F_6$, $CHF_3$, and $CF_4$. In an embodiment, the etch 1030 may remove the conductive cap metal layer 1020 in the regions not covered by the resist layer 1010. In an embodiment, the etch may stop on the exterior portion 940 (e.g. GaN) of the regrown semiconductor. In other embodiment(s) (not shown), the etch may stop in an Al-containing etch stop layer (e.g. $Al_2O_3$ or AlN) that comprises either the first dielectric layer 124 or the second dielectric layer 126. Structure 1001 results.

Figure 11:
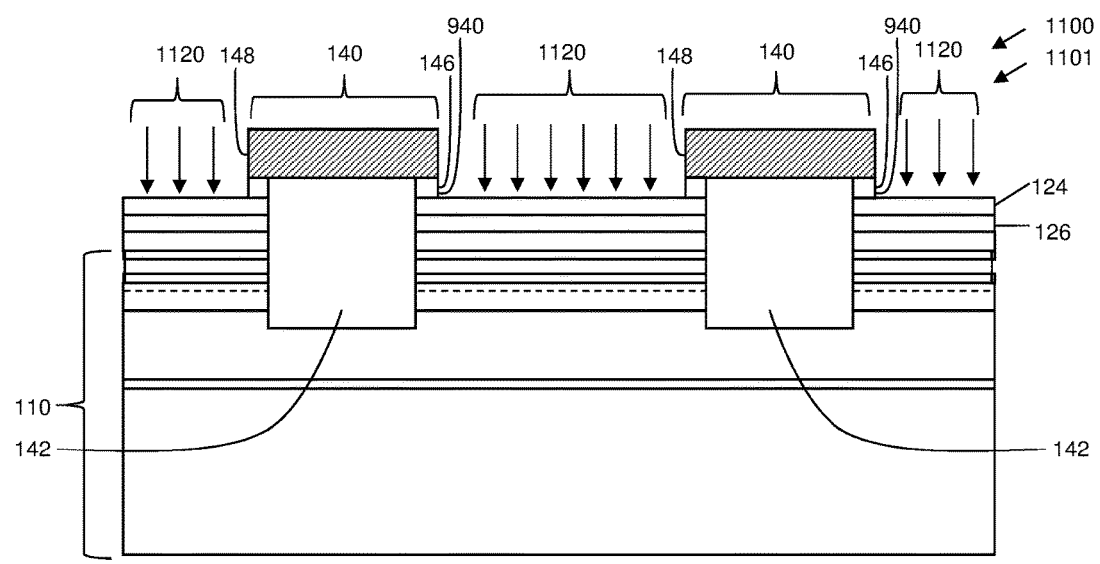

In an embodiment, block 514 of FIG. 5 and step 1100 of FIG. 11 describe further processing of the structure 1001 of FIG. 10. In an embodiment, the method may include etching the regrown semiconductor layers 920 of FIG. 9 in the exterior portion 940 to complete the source/drain region(s) 140. In an embodiment, the conductive cap(s) 148 may act as hard masks for the etch. Etching the exterior portion 940 (e.g. polycrystalline GaN) may include etching using one or more dry and/or wet etch technique(s) such as reactive ion etching (RIE), ICP etching, ECR etching, and wet chemical etching according to an embodiment. Suitable wet chemical etch chemistries may include one or more of hydrofluoric acid (HF), buffered HF, buffered oxide etch (BOE), phosphoric acid ($H_3PO_4$), or other suitable wet etchant(s), according to an embodiment. Suitable dry etching techniques include one or more etches including, but not limited to, Cl, $BCl_3$, HBr, and $SiCl_4$, according to an embodiment. In other embodiment(s) (not shown), one or more F-based dry etchants (e.g. $SF_6$, $C_2F_6$, $CF_4$) may be added to the Cl-based etchants such that the etch may remove GaN and then stop on an Al-containing etch stop layer (e.g. $Al_2O_3$ or AlN) that comprises either the first dielectric layer 124 or the second dielectric layer 126. In an embodiment, the etching of the exterior portion 940 leaves only that portion covered by the conductive cap 148 and results in formation of the regrown region(s) of overhang regions 146 of FIG. 1. The source/drain regions(s) 140 are now formed. In an embodiment, the semiconductor wafer 110 with source/drain regions 140 may be annealed to facilitate an intimate contact between the conductive cap 148 and the regrown region 142. In an embodiment, an annealing system (e.g. a rapid thermal annealer) with suitable ambient (e.g. nitrogen gas) may be used to anneal the source/drain regions 140 at a temperature between about 200 degrees Celsius and about 600 degrees Celsius. In other embodiments, the regrown contacts may be annealed between about 100 degrees Celsius and about 1000 degrees Celsius. Structure 1101 results.

Figure 12:
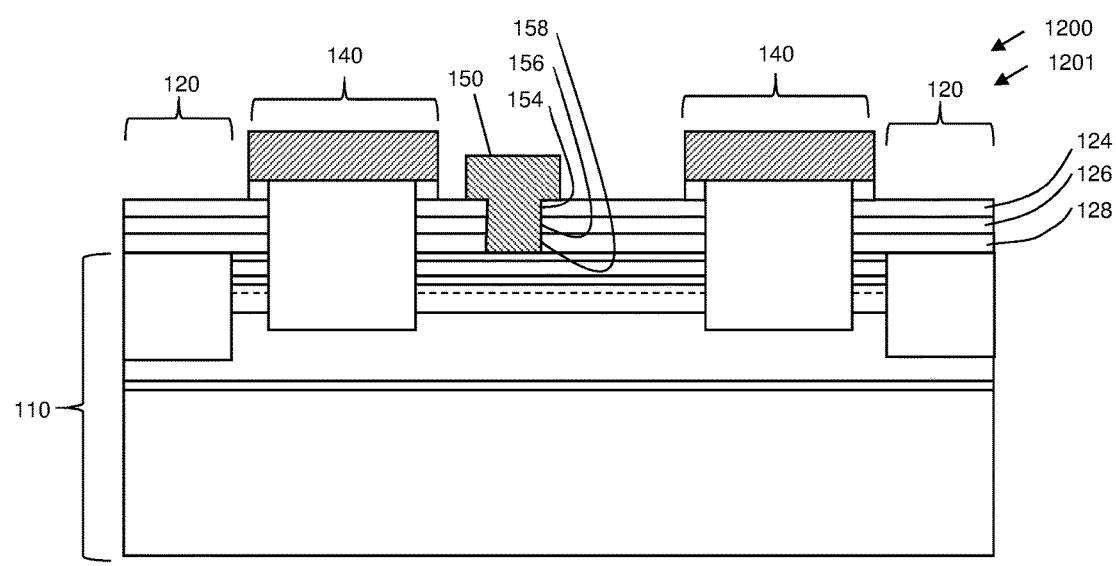

In an embodiment, block 516 of FIG. 5 and step 1200 of FIG. 12 describe further processing of the structure 1101 of FIG. 11. In an embodiment, the method may include creating isolation regions 120 and additional electrodes (e.g. gate electrodes).

Referring to block 516 of FIG. 5 and step 1200 of FIG. 12, forming the isolation region may include depositing resist (e.g. photo-resist, not shown) over the structure 1101 of FIG. 11 and then defining openings in the resist layer. Using ion implantation, a dopant species (e.g. one or more of oxygen, nitrogen, boron, and helium) may be driven into the semiconductor substrate 110 to create the isolation regions 120. In an embodiment, the energy and dose of the implant may be configured to create a sufficient amount of damage in the crystal structure of the semiconductor substrate 110 such that the semiconductor substrate is substantially insulating within the isolation regions 120. In other embodiments (not shown), forming the isolation regions 1120 may include, first, etching some or all of the semiconductor layers in the semiconductor substrate 110 and then ion implanting to enhance the resistivity in the remaining semiconductor layers and/or the host substrate.

Referring again to block 516 of FIG. 5 and step 1200 of FIG. 12, and in an embodiment, forming the additional electrodes may include forming a gate electrode 150. In an embodiment of the GaN HFET 100 of FIG. 1, the gate electrode 150 may be formed by creating first, second, and third gate openings in first, second, and third dielectric layers 124, 126, and 128 using methods (e.g. combination of dry and wet etches) analogous to those used to form openings in the dielectric layers 124, 126, and 128 in block 508 of FIG. 5, and as depicted in a step 800 of FIG. 8. In an embodiment, the gate electrode 150 may be formed using a "lift-off" technique wherein opening(s) for the gate are created in a resist layer (not shown) over the gate openings 154, 156, and 158. A gate metal layer is deposited over the resist layer and the opening(s). Solvents (e.g. acetone and/or resist strip) may be used to dissolve the resist layer and lift off the gate metal. Structure 1201 results.

In other embodiments (e.g. the MISFET of FIG. 3), the gate dielectric 255 of FIG. 2 may be formed prior to forming the gate electrode 150 (not shown). In an embodiment, forming the gate dielectric 255 may include depositing one or more insulating materials (e.g. one or more of $SiO_2$, SiN, $Al_2O_3$, and/or AlN). The gate dielectric 255 may be formed using one or more of LPCVD, ALD, PECVD, PVD, sputtering, MOCVD, MBE, ICP, ECR or other suitable techniques.

Without departing from the scope of the inventive subject matter, additional embodiments of the method may be used to create the JFET 300 of FIG. 3. In these additional embodiments of the method described in the flow diagram of FIG. 5, and as described pictorially in FIGS. 6-12, the gate electrode 350 of the JFET 300 may be fabricated by configuring the source/drain regions 140 whose fabrication is described in blocks 508-514 of FIG. 5 and FIGS. 8-11 as a gate electrode. In these embodiments, the gate electrode 350 of FIG. 3 may be realized by doping (e.g. with a p-type dopant such as Mg) the regrown semiconductor layer 920 described in block 510 of FIG. 5 and in FIG. 9. In these embodiments, an activation anneal may be used to activate the doping in the regrown semiconductor layer 920 of FIG. 9. In an embodiment, the activation anneal temperature may be between about 800 degrees Celsius and about 1300 degrees Celsius.

Figure 13:
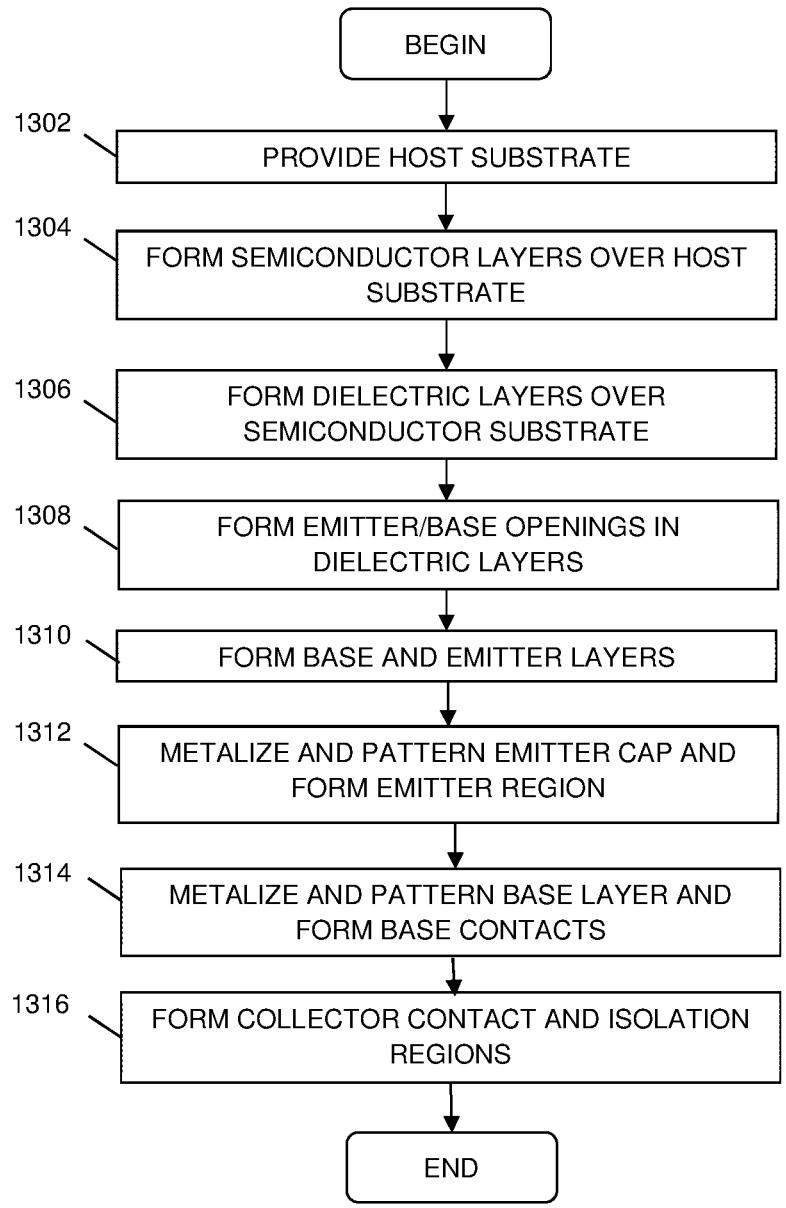
FIG. 13 is a process flow diagram describing a method for fabricating the bipolar device with a regrown contact of FIG. 4 in accordance with an embodiment.

Without departing from the scope of the inventive subject matter, the bipolar device 400 of FIG. 4 may be fabricated using an additional embodiment(s) of the method described above. The flowchart of FIG. 13 describes such embodiments of the method. FIG. 13 should be viewed alongside FIGS. 14-20 which illustrate cross-sectional, side views of a series of fabrication steps for producing the HBT bipolar device of FIG. 4, in accordance with an example embodiment.

Figure 14:
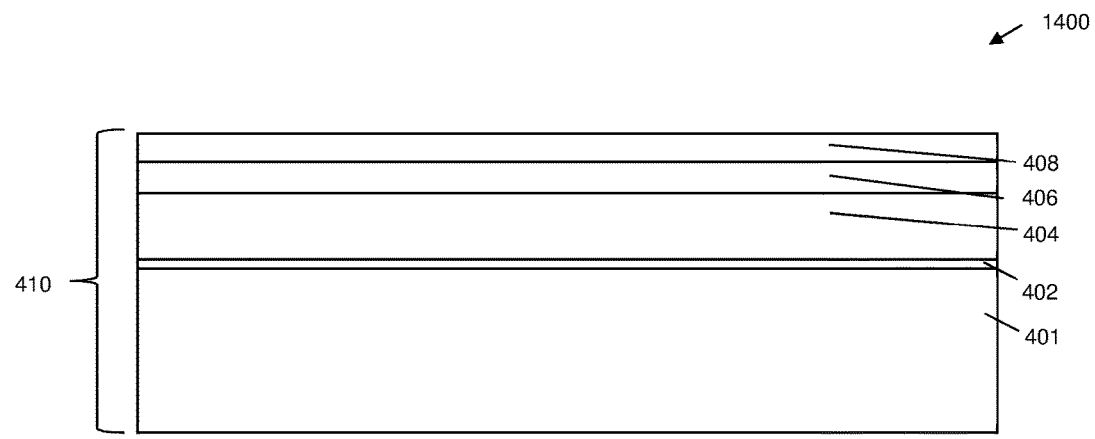
FIGS. 14-22 are cross-sectional, side views of a series of fabrication steps for producing the bipolar device with a regrown contact of FIG. 4, in accordance with an embodiment of the method of fabrication.

Referring both to FIG. 13 and FIG. 14, the method may begin, in block 1302 of FIG. 13 and as depicted in a step 1400 of FIG. 14, by providing a host substrate 401. As discussed previously, the host substrate 401 may include SiC, or may include other materials such as sapphire, Si, GaN, AlN, diamond, poly-SiC, silicon on insulator, GaAs, InP, or other substantially insulating or high resistivity materials.

In block 1304 of FIG. 13, and as depicted in the step 1400 of FIG. 14, an embodiment of the method may include forming a number of semiconductor layers on or over the host substrate 401. Forming the semiconductor layers may include forming a nucleation layer 402 on or over the host substrate 401, forming a buffer layer 404 on or over the nucleation layer 402, forming a sub-collector layer 406 on or over the buffer layer 404, and forming a collector layer 408 on or over the sub-collector layer 406. As discussed previously, embodiments of the nucleation layer 402, the buffer layer 404, the sub-collector layer 406, and the collector layer 408 may include materials selected from AlN, GaN, AlGaN, InAlN, InGaN other suitable materials. In an embodiment, these semiconductor layers may be grown using one of metal-organo chemical vapor deposition (MOCVD), molecular beam epitaxy (MBE), hydride-vapor phase epitaxy (HVPE) or a combination of these techniques, although other suitable techniques alternatively may be used. Semiconductor substrate 410 results.

Figure 15:
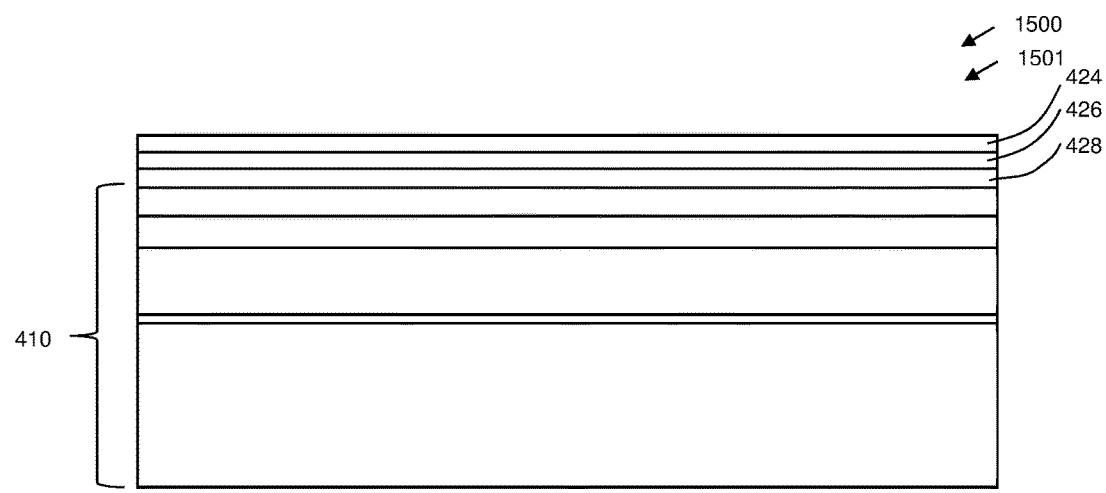

In block 1306 of FIG. 13, and as depicted in a step 1500 of FIG. 15, an embodiment of the method may include forming one or more of the first dielectric layer 424, second dielectric layer 426, and third dielectric layer 428 on or over the semiconductor substrate 410. As discussed previously, in an embodiment, the first, second, and third dielectric layers 424, 426, and 428 may be formed analogously to the first, second, and third dielectric layers 124, 126, and 128 in block 506 of FIG. 5 and step 700 of FIG. 7. Structure 1501 results.

Figure 16:
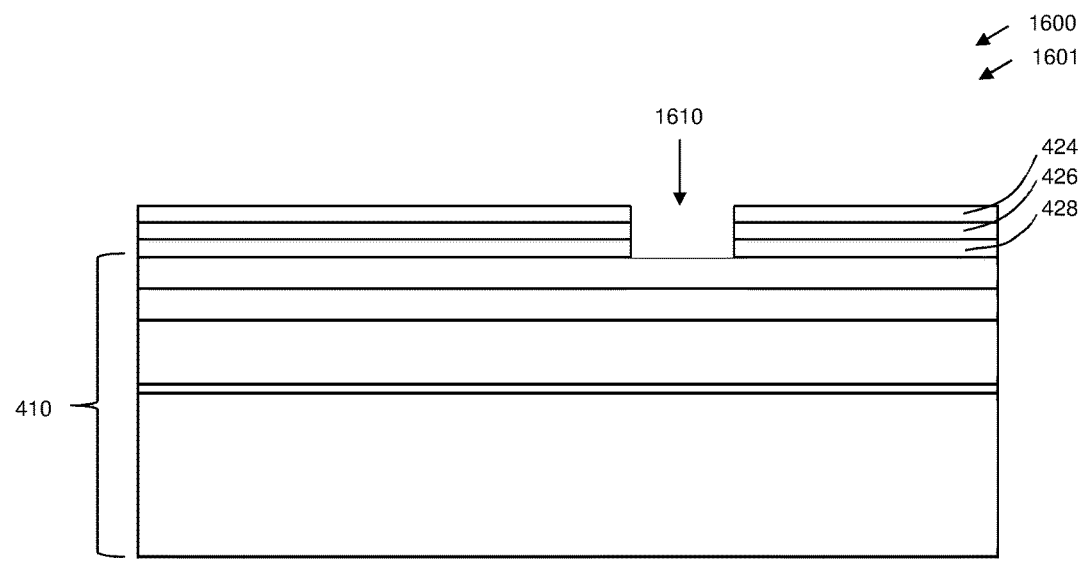

In block 1308 of FIG. 13, and as depicted in a step 1600 of FIG. 16, an embodiment of the method may include forming emitter/base openings 1610 (i.e. openings) in one or more the first, second, and third dielectric layers 424, 426, and 428. In an embodiment, forming the openings 1610 may include etching through the first, second, and third dielectric layers 424, 426, and 428 in a manner analogous to etching through the first, second, and third dielectric layers 124, 126, and 128 described in connection with block 508 of FIG. 5 and step 800 of FIG. 8.

Figure 17:
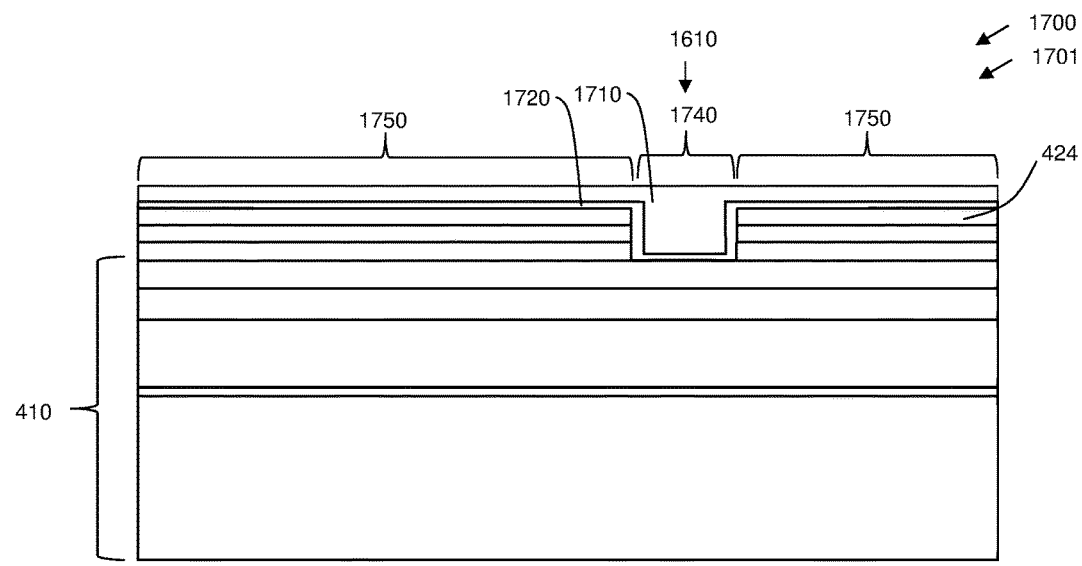

In block 1310 of FIG. 13, and as depicted in a step 1700 of FIG. 17, an embodiment of the method may include forming emitter and base layers 1710 and 1720 (i.e. regrown regions) within the emitter/base opening 1610. Referring specifically to the bipolar device fabrication step 1700 of FIG. 17, an embodiment may include growing the base layer 1720 and emitter layer 1710 over the structure 1601 of FIG. 16. It should be appreciated that the base layer 1720 and the emitter layer 1710 refer to intermediate structures, that after further processing, become the emitter region 443, the base region 444, and the base overhang region 452. Forming the base layer 1720 and emitter layer 1710 may include forming a contact portion 1740 over the semiconductor substrate 410 and within the emitter/base opening 1610 and forming an exterior portion 1750 in contact with the first dielectric layer 424 outside the emitter/base opening 1610, according to an embodiment. In an embodiment, the base layer 1720 may contact the semiconductor substrate 410 within the emitter/base opening 1610. In an embodiment, the base layer 1720 and the emitter layer 1710 are grown at a temperature between about 900 degrees Celsius and about 1200 degrees Celsius. In other embodiments, the emitter and base layers 1710 and 1710 may be grown at temperatures between about 600 degrees Celsius and about 1300 degrees Celsius. The emitter and base layers 1710 and 1720 may also be grown at other higher or lower temperatures in other, further embodiments. In an embodiment, the emitter and base layers 1710 and 1720 may be grown by MBE. In other embodiments, the base and emitter layers 1710 and 1720 may be grown by MOCVD. In still other embodiments, the emitter and base layers 1710 and 1720 may be grown by physical vapor deposition (PVD), chemical vapor deposition (CVD), hydride vapor-phase epitaxy (HVPE), or other suitable technique(s). In an embodiment, the contact portion 1740 (e.g. the portion inside of emitter/base opening 1610) of the emitter layer 1710 and the base layer 1720 may be formed as single crystal semiconductor layers. In other embodiments, the contact portion 1740 of the base layer 1720 and the emitter region 1710 may be formed as polycrystalline layers. In an embodiment, the exterior portion 1750 of the base layer 1720 and emitter layer 1710 may be formed as polycrystalline semiconductor layers. In other embodiments, the exterior portion 1750 of the base layer 1720 and emitter layer 1710 may be formed as single crystal semiconductor layers. In an embodiment (not shown), the exterior portion 1750 of the base layer 1720 may be formed as single crystal layers within a range of between about 100 angstroms and about 50000 angstroms outside the emitter/base opening 1610 and as polycrystalline semiconductor layers outside this range of distances. Without departing from the scope of the inventive subject matter, the range of single crystal material within the exterior portions 1740 of the base layer 1720 and the emitter region 1720 formed outside the emitter/base openings 1610 may take on larger or smaller values than between about 100 angstroms and about 50000 angstroms. In these embodiments, an activation anneal may be used to activate the doping in the regrown semiconductor layer 920 of FIG. 9. In an embodiment, dopants in the emitter layer 1710 and/or the base layer 1710 may be activated using an activation anneal. In an embodiment, the activation anneal temperature may be between about 800 degrees Celsius and about 1300 degrees Celsius. Structure 1701 results.

Figure 18:
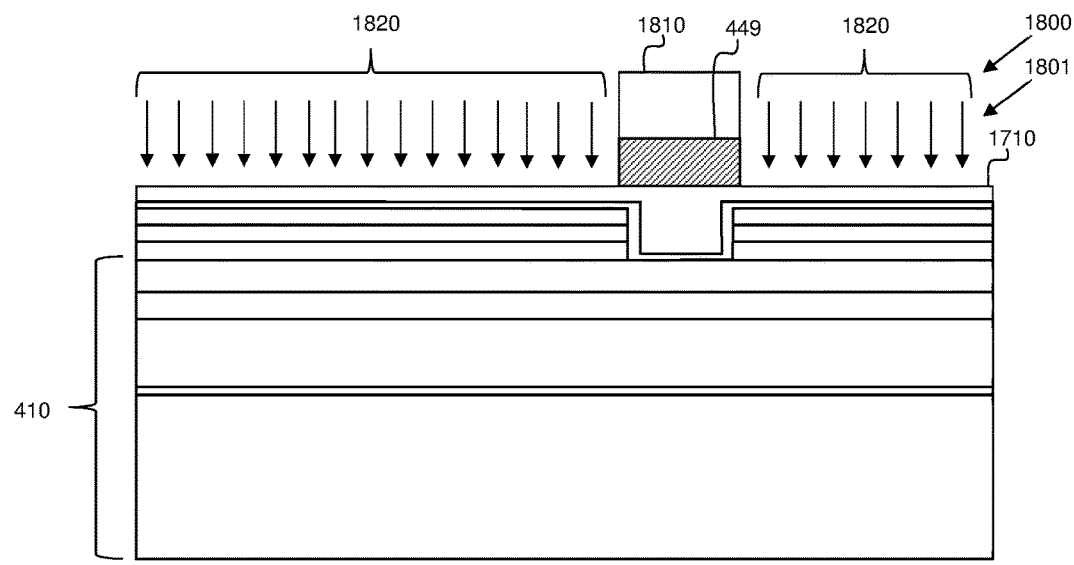

In block 1312 of FIG. 13, and as depicted in step 1800 of FIG. 18, an embodiment of the method may include forming and patterning the emitter cap 449 (i.e. conductive cap) over the emitter/base region (i.e. regrown region). Patterning the emitter cap 449 may be accomplished using the methods analogous to embodiments of the method described in block 512 of FIG. 5 and step 1000 of FIG. 10. For example, in an embodiment, forming the emitter cap 449 may include depositing a conductive layer (e.g. Ti/Al, not shown) over the emitter region 1710 using an etchant 1820 (e.g. dry etch and/or wet etch techniques). Structure 1801 results.

Figure 19:
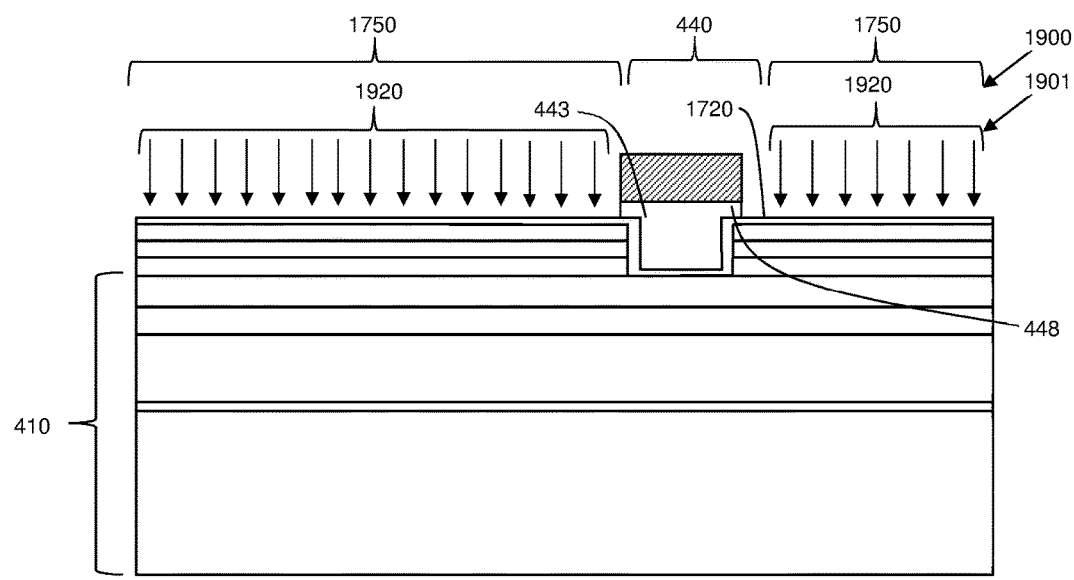

In an embodiment, block 1314 of FIG. 13 and step 1900 of FIG. 19 describe further processing of the structure 1801 of FIG. 18. In an embodiment, the method may include etching the emitter layer 1710 of FIG. 17 in the exterior portion 1750 to expose the base layer 1720. In an embodiment, the conductive cap 449 may act as hard masks for the etch. Etching the exterior portion 1750 (e.g. polycrystalline GaN) may include etching using one or more dry and/or wet etch technique(s) such as reactive ion etching (RIE), ICP etching, ECR etching, and wet chemical etching according to an embodiment. Suitable wet chemical etch chemistries may include one or more of hydrofluoric acid (HF), buffered HF, buffered oxide etch (BOE), phosphoric acid ($H_3PO_4$), bromic acid (HBr) or other suitable wet etchant(s), according to an embodiment. Suitable dry etching techniques include one or more etches including, but not limited to, Cl, $BCl_3$, and $SiCl_4$, according to an embodiment. In other embodiment(s) (not shown), one or more F-based dry etchants (e.g. $SF_6$, $C_2F_6$, $CF_4$) may be added to the etchants such that the etch may remove GaN and then stop on an Al-containing etch stop layer (e.g. $Al_2O_3$ or AlN) that comprises either the first dielectric layer 424 or the second dielectric layer 126. In an embodiment, the etching of the exterior portion 1750 leaves only that portion covered by the conductive cap 449 and results in formation of the emitter region 443 and the emitter overhang regions 448 of FIG. 4. In an embodiment, the semiconductor wafer 410 with the emitter region 443 may be annealed to facilitate an ohmic contact between the conductive cap 449 and the emitter region 443. In an embodiment, an annealing system (e.g. a rapid thermal annealer) with suitable ambient (e.g. nitrogen gas) may be used to anneal regrown emitter/base contact 440 at a temperature between about 200 degrees Celsius and about 600 degrees Celsius. In other embodiments, the regrown contacts may be annealed between about 100 degrees Celsius and about 1000 degrees Celsius. Structure 1901 results.

Figure 20:
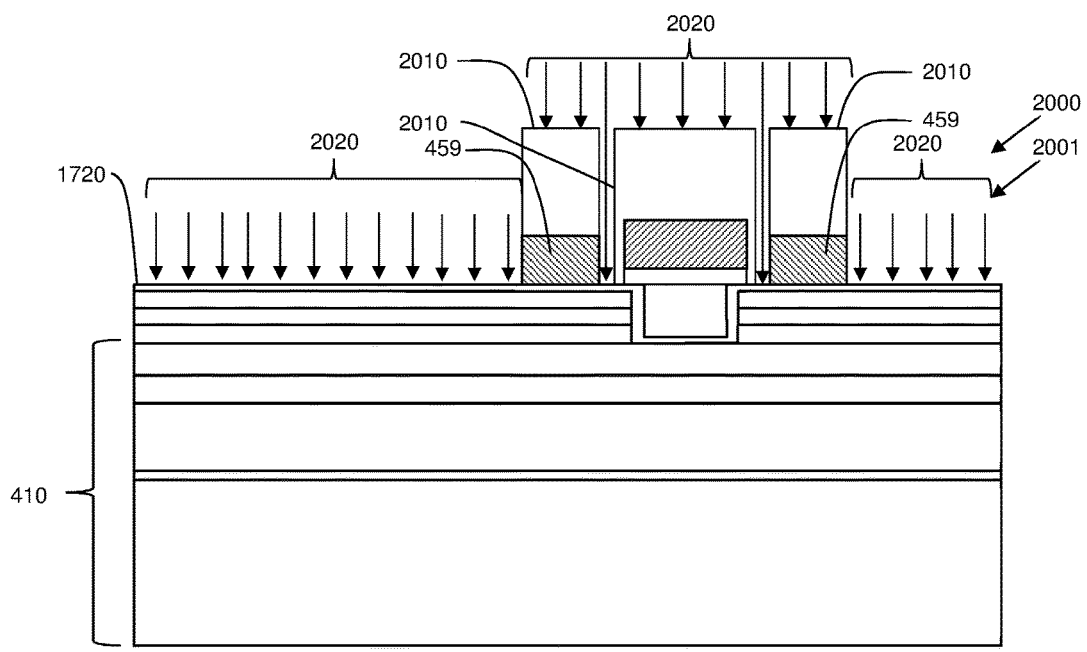

In block 1314 of FIG. 13, and as depicted in step 2000 of FIG. 20, an embodiment of the method may include forming and patterning the base caps 459 (i.e. conductive cap) over the base layer 1720. Patterning the base caps 459 may be accomplished using the methods analogous to embodiments of the method described in block 1312 of FIG. 13 and step 1800 of FIG. 18. For example, in an embodiment, forming the base caps 459 may include depositing a conductive layer (e.g. Ti/Al, not shown) over the base layer 1720 using well-known deposition techniques (e.g. evaporation, sputtering, or PVD), applying and patterning a resist layer 2010 over the base layer to define the base cap pattern, and etching the base caps using an etchant 2020. Structure 2001 results.

Figure 21:
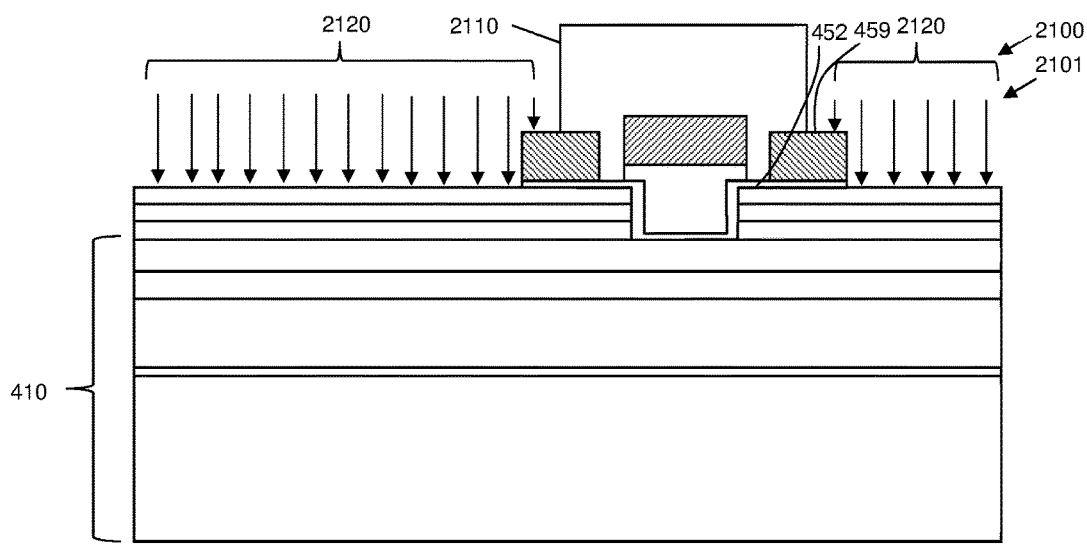

In an embodiment, block 1314 of FIG. 13 and step 2100 of FIG. 21 describe further processing of the structure 2001 of FIG. 20. In an embodiment, the method may include applying a resist layer 2110 (e.g. photo-resist) over the base caps 459 and etching the base layer 1720 of FIGS. 17-20 (not shown here) in an exterior base portion 2120 to expose the first dielectric layer 424. In an embodiment, the resist layer 2110 may be pulled back from the edges of the base caps 459 so that the base caps 449 may act as hard masks for the etch. Etching the exterior base portion 2120 (e.g. polycrystalline GaN) may be accomplished using techniques analogous to and described in connection with block 1312 of FIG. 13 and step 1900 of FIG. 19. In an embodiment, the etching of the exterior base portion 2110 leaves only that portion of the base layer 1720 of FIGS. 17-20 (not shown here) covered by the base caps 459. In an embodiment, this forms the base overhang region 452. Base contacts 450 are now formed. In an embodiment, and using techniques analogous to the formation of the regrown emitter/base region 440 described in block 1312 of FIG. 13 and step 1900 of FIG. 19, the semiconductor wafer 410 with the base contact 450 may be annealed to facilitate an ohmic contact between the base contact 459 and the base overhang region 452. Structure 2101 results.

Figure 22:
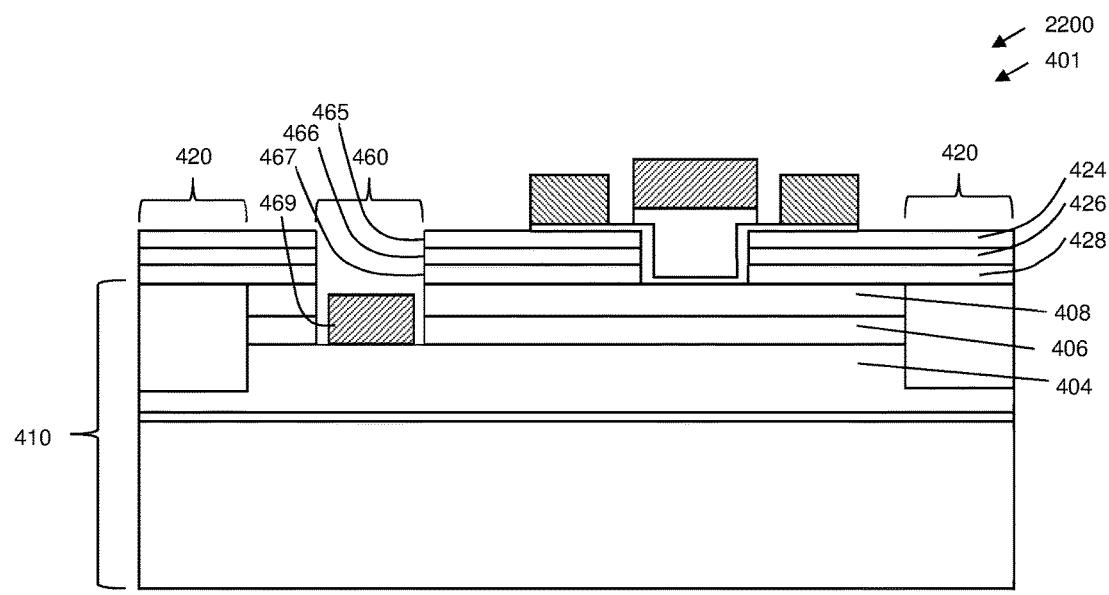

In an embodiment, block 1316 of FIG. 13 and step 2200 of FIG. 22 describe further processing of the structure 2101 of FIG. 21. In an embodiment, the method may include creating the collector region 460 and isolation regions 420 of FIG. 4. Forming the collector region 460 may include forming a collector contact 469. In an embodiment of the method for forming the bipolar device of FIG. 4, the collector contact 469 may be formed by creating first, second, and third gate openings in first, second, and third dielectric layers 424, 426, and 428 using methods (e.g. combination of dry and wet etches) analogous to those used to form openings in the dielectric layers 424, 426, and 428 in block 1308 of FIG. 13, and as depicted in a step 1600 of FIG. 16. In addition, an etchant may be used to etch the collector layer 408 (e.g. GaN). Such etch techniques have been described earlier in connection with, e.g., block 1310 of FIG. 13 and step 1700 of FIG. 17. In an embodiment, the collector contacts 469 may be formed using a "lift-off" technique wherein opening(s) for the gate are created in a resist layer (not shown) over the gate openings. Collector metal is deposited over the resist layer and the opening(s). Solvents (e.g. acetone and/or resist strip) may be used to dissolve the resist layer and lift off the collector contact.

Referring again to block 1316 of FIG. 13 and step 2200 of FIG. 22, forming the isolation regions 420 may include depositing resist (e.g. photo-resist, not shown) over the structure 2101 of FIG. 21 and then defining openings in the resist layer. Using ion implantation, a dopant species (e.g. one or more of oxygen, nitrogen, boron, and helium) may be driven into the semiconductor substrate 410 to create the isolation regions 420. In an embodiment, the energy and dose of the implant may be configured to create a sufficient amount of damage in the crystal structure of the semiconductor substrate 410 such that the semiconductor substrate is substantially insulating within the isolation regions 420. In other embodiments (not shown), forming the isolation regions 420 may include, first, etching some or all of the semiconductor layers in the semiconductor substrate 410 and then implanting a dopant species into the remaining semiconductor layers to enhance the resistivity in the remaining semiconductor layers and/or the host substrate. In these other embodiments (not shown), forming the isolation regions 420 may include, first, etching some or all of the collector layer 408 and the sub-collector layer 406 and then implanting a dopant species into the remaining material to enhance the resistivity in the remaining semiconductor layers and/or the host substrate. The completed bipolar device 401 results.

Various embodiments of a semiconductor device have been disclosed. According to an embodiment, a semiconductor device may include a semiconductor substrate that includes a host substrate, an upper surface, and a semiconductor layer formed over the host substrate. In an embodiment, a first dielectric layer may be disposed over the upper surface of the semiconductor substrate. In an embodiment, the semiconductor device may include a regrown contact formed over and within the semiconductor substrate. In an embodiment, the regrown contact may include a first opening formed in the first dielectric layer, a regrown region formed within the first opening and electrically coupled to the semiconductor substrate, an overhang region, coupled to the regrown region and formed over the first dielectric layer adjacent the first opening, and a conductive cap formed over the regrown region and the overhang region.

Other embodiments of the disclosed subject matter may include a semiconductor substrate that includes a host substrate, an upper surface, and a collector layer that includes a group-III nitride semiconductor disposed over the host substrate. According to an embodiment, the group-III nitride bipolar device may include a first dielectric layer disposed over the upper surface of the semiconductor substrate. In an embodiment, the group-III nitride bipolar device may also include a regrown contact. According to an embodiment, the regrown contact may be formed over and within the semiconductor substrate that includes a first opening formed in the first dielectric layer, a regrown region formed within the first opening and electrically coupled to the semiconductor substrate, an overhang region coupled to the regrown region and formed over the first dielectric layer adjacent the first opening, and a conductive cap formed over the regrown region and the overhang region. An embodiment may also include a second dielectric layer, configured as an etch stop layer resistant to an etchant of the first dielectric layer, disposed between the semiconductor substrate and the first dielectric layer, wherein the regrown region extends through a second opening in the second dielectric layer, and a base contact formed over the semiconductor substrate, adjacent the regrown contact, and coupled to the overhang region.

Still other embodiments of the disclosed subject matter include a method for fabricating a semiconductor device. According to an embodiment, the method may include providing a semiconductor substrate that includes a host substrate, an upper surface, and a semiconductor layer, forming a first dielectric layer over the upper surface of the semiconductor substrate, forming a first opening in the first dielectric layer, forming a regrown semiconductor layer over the first dielectric layer and over the semiconductor substrate through the first opening, forming a conductive cap over the first opening, and etching an exterior portion of the regrown semiconductor layer.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

For the sake of brevity, conventional semiconductor fabrication techniques may not be described in detail herein. In addition, certain terminology may also be used herein for reference only, and thus are not intended to be limiting, and the terms "first", "second" and other such numerical terms referring to structures do not imply a sequence or order unless clearly indicated by the context.

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with) another element, and not necessarily mechanically. Thus, although the schematic shown in the figures depict one exemplary arrangement of elements, additional intervening elements, devices, features, or components may be present in an embodiment of the depicted subject matter.

What is claimed is:

1. A semiconductor device comprising:
  a semiconductor substrate that includes a host substrate, an upper surface, and a semiconductor layer formed over the host substrate;
  a first dielectric layer disposed over the upper surface of the semiconductor substrate; and
  a regrown contact formed over and within the semiconductor substrate comprising:
    a first opening formed in the first dielectric layer;
    a regrown region formed within the first opening and electrically coupled to the semiconductor substrate;
    an overhang region comprising a semiconductor material coupled to the regrown region and formed over the first dielectric layer, adjacent the first opening; and
    a conductive cap formed over the regrown region and the overhang region.

2. The semiconductor device of claim 1, further comprising a second dielectric layer disposed between the semiconductor substrate and the first dielectric layer, wherein the regrown region extends through a second opening in the second dielectric layer.

3. The semiconductor device of claim 1, wherein the semiconductor layer comprises a collector layer.

4. The semiconductor device of claim 1, wherein a base contact is formed over the semiconductor substrate, adjacent the regrown contact, and coupled to the overhang region.

5. The semiconductor device of claim 1 wherein the conductive cap is gold-free.

6. The semiconductor device of claim 1, wherein the semiconductor substrate comprises a group-III nitride semiconductor.

7. The semiconductor device of claim 2, wherein the second dielectric layer is configured as an etch stop layer resistant to an etchant of the first dielectric layer.

8. The semiconductor device of claim 7, further comprising a third dielectric layer disposed between the semiconductor substrate and the second dielectric layer, wherein the regrown region extends through a third opening in the third dielectric layer.

9. The semiconductor device of claim 3, further comprising a collector region comprising:
  a first collector opening formed in the first dielectric layer adjacent the regrown contact; and
  a collector contact formed within the first collector opening, adjacent the collector layer, and over a sub-collector layer formed over the host substrate and coupled to the collector layer.

10. The semiconductor device of claim 3, wherein the regrown region comprises an emitter region formed over the collector layer and a base region formed between the emitter region and the collector layer.

11. The semiconductor device of claim 10, wherein the emitter region includes a n-type dopant, the base region includes a p-type dopant, and the collector layer includes a n-type dopant.

12. The semiconductor device of claim 11, wherein the base region forms a p-n junction with the emitter region and a p-n junction with the collector layer.

13. A group-III nitride bipolar device comprising:
  a semiconductor substrate that includes a host substrate, an upper surface, and a collector layer, disposed over the host substrate, that includes a group-III nitride semiconductor;
  a first dielectric layer disposed over the upper surface of the semiconductor substrate;
  a regrown contact formed over and within the semiconductor substrate comprising:
    a first opening formed in the first dielectric layer;
    a regrown region formed within the first opening and electrically coupled to the semiconductor substrate;
    an overhang region coupled to the regrown region and formed over the first dielectric layer, adjacent the first opening; and
    a conductive cap formed over the regrown region and the overhang region;
  a second dielectric layer, configured as an etch stop layer resistant to an etchant of the first dielectric layer, disposed between the semiconductor substrate and the first dielectric layer, wherein the regrown region extends through a second opening in the second dielectric layer; and a base contact formed over the semiconductor substrate and over the first dielectric layer, adjacent the regrown contact, and coupled to the overhang region.

14. The bipolar device of claim 13, further comprising a collector region comprising:

a first collector opening formed in the first dielectric layer adjacent the regrown contact; and a collector contact formed within the first collector opening, adjacent the collector layer, and over a sub-collector layer formed over the host substrate.

15. A method for fabricating a semiconductor device, the method comprising:

providing a semiconductor substrate that includes a host substrate, an upper surface, and a semiconductor layer;

forming a first dielectric layer over the upper surface of the semiconductor substrate;

forming a first opening in the first dielectric layer;

forming a regrown semiconductor layer over the first dielectric layer and over the semiconductor substrate through the first opening;

forming a conductive cap over the first opening; and etching an exterior portion of the regrown semiconductor layer, forming a regrown region within the first opening, wherein the regrown region is coupled to an overhang region, over the first dielectric layer, outside the first opening, and under the cap.

16. The method of claim 15, further comprising forming a second dielectric layer configured as an etch stop resistant to an etchant of the first dielectric layer, over the upper surface of the semiconductor substrate and forming a second opening in the second dielectric layer through which the regrown semiconductor layer extends.

17. The method of claim 15, wherein forming the conductive cap includes dry etching.

18. The method of claim 15, further comprising forming a base contact over the exterior portion of the regrown semiconductor layer.

19. The method of claim 15, further comprising forming a collector region adjacent the first opening.

20. The method of claim 15, further comprising creating isolation regions within and along the upper surface of the semiconductor substrate to define an active area.

* * * * *